US011430755B2

(12) United States Patent
Hirai

(10) Patent No.: US 11,430,755 B2
(45) Date of Patent: *Aug. 30, 2022

(54) ELECTRONIC DEVICE INCLUDING FIRST SUBSTRATE HAVING FIRST AND SECOND SURFACES OPPOSITE FROM EACH OTHER, SECOND SUBSTRATE FACING FIRST SURFACE, AND DRIVE CIRCUIT FACING SECOND SURFACE

(71) Applicant: BROTHER KOGYO KABUSHIKI KAISHA, Nagoya (JP)

(72) Inventor: Keita Hirai, Nagoya (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/078,787

(22) Filed: Oct. 23, 2020

(65) Prior Publication Data

US 2021/0043595 A1 Feb. 11, 2021

Related U.S. Application Data

(63) Continuation of application No. 15/996,754, filed on Jun. 4, 2018, now Pat. No. 10,847,484.

(30) Foreign Application Priority Data

Sep. 29, 2017 (JP) .............................. JP2017-192154

(51) Int. Cl.
*H01L 25/065* (2006.01)
*H01L 23/00* (2006.01)
(Continued)

(52) U.S. Cl.
CPC .......... *H01L 24/16* (2013.01); *B41J 2/14233* (2013.01); *H01L 21/486* (2013.01);
(Continued)

(58) Field of Classification Search
CPC ..... H01L 24/16; H01L 41/0475; H01L 27/20; H01L 41/0973; H01L 25/0655;
(Continued)

(56) References Cited

U.S. PATENT DOCUMENTS 10,525,702 B2 * 1/2020 Hirai .................... B41J 2/04586
10,847,484 B2 * 11/2020 Hirai ................... H01L 41/0475
(Continued)

FOREIGN PATENT DOCUMENTS

JP 2016-165847 A 9/2016
JP 2016-172345 A 9/2016
(Continued)

OTHER PUBLICATIONS

Office Action issued in corresponding Japanese Patent Application No. 2017-192154, dated Jul. 27, 2021.
(Continued)

*Primary Examiner* — Thanh T Nguyen
(74) *Attorney, Agent, or Firm* — Merchant & Gould P.C.

(57) ABSTRACT

An electronic device includes: a first substrate having a first surface and a second surface opposite from the first surface; a second substrate facing the first surface; driven elements provided at the second substrate; a drive circuit facing the second surface; a first interconnect provided at the first surface; a second interconnect provided at the second surface; a through-substrate interconnection part penetrating the first substrate in a thickness direction thereof; a first bump part; and a second bump part. The drive circuit is capable of outputting drive signals for driving the driven elements. The through-substrate interconnection part electrically connects the first interconnect and the second interconnect. The first bump part electrically connects the first interconnect and the driven elements. The second bump part electrically connects the second interconnect and the drive (Continued)

circuit. The through-substrate interconnection part has an electrical resistance lower than an electrical resistance of the second bump part.

13 Claims, 15 Drawing Sheets

(51) Int. Cl.

| | |
|---|---|
| H01L 25/16 | (2006.01) |
| H01L 23/538 | (2006.01) |
| H01L 21/48 | (2006.01) |
| H01L 41/04 | (2006.01) |
| H01L 41/09 | (2006.01) |
| H01L 27/20 | (2006.01) |
| H01L 41/047 | (2006.01) |
| B41J 2/14 | (2006.01) |
| B41J 2/045 | (2006.01) |
| H01L 41/187 | (2006.01) |
| H01L 41/053 | (2006.01) |

(52) U.S. Cl.
CPC .......... *H01L 23/5384* (2013.01); *H01L 24/17* (2013.01); *H01L 25/0655* (2013.01); *H01L 25/162* (2013.01); *H01L 27/20* (2013.01); *H01L 41/042* (2013.01); *H01L 41/0475* (2013.01); *H01L 41/0973* (2013.01); *B41J 2/04541* (2013.01); *B41J 2/04586* (2013.01); *B41J 2002/14491* (2013.01); *B41J 2202/18* (2013.01); *H01L 41/047* (2013.01); *H01L 41/053* (2013.01); *H01L 41/1876* (2013.01); *H01L 2224/16227* (2013.01); *H01L 2224/17177* (2013.01); *H01L 2924/1426* (2013.01); *H01L 2924/1461* (2013.01)

(58) Field of Classification Search
CPC ..... H01L 24/17; H01L 41/042; H01L 21/486; H01L 23/5384; H01L 25/162; H01L 2224/17177; H01L 41/053; H01L 2224/16227; H01L 2924/1426; H01L 2924/1461; H01L 41/047; H01L 41/1876; B41J 2/14233; B41J 2202/18; B41J 2002/14491; B41J 2/04586; B41J 2/04541

See application file for complete search history.

(56) References Cited

U.S. PATENT DOCUMENTS

| | | |
|---|---|---|
| 2012/0167823 A1 | 7/2012 | Gardner et al. |
| 2016/0079207 A1 | 3/2016 | Yamaguchi et al. |
| 2016/0263887 A1 | 9/2016 | Tanaka |
| 2017/0066241 A1 | 3/2017 | Naganuma et al. |
| 2017/0217177 A1* | 8/2017 | Takabe ................ H01L 41/0475 |
| 2017/0266969 A1 | 9/2017 | Kashimura |
| 2018/0015717 A1 | 1/2018 | Tanaka |

FOREIGN PATENT DOCUMENTS

| | | |
|---|---|---|
| JP | 2017-52135 A | 3/2017 |
| JP | 2017-124540 A | 7/2017 |
| JP | 2017-164944 A | 9/2017 |
| WO | 2014/175133 A1 | 10/2014 |
| WO | 2016/147634 A1 | 9/2016 |

OTHER PUBLICATIONS

Office Action (Notice of Reason for Refusal) issued in corresponding Japanese Patent Application No. 2017-192154, dated Jan. 5, 2022.

* cited by examiner

ELECTRONIC DEVICE INCLUDING FIRST SUBSTRATE HAVING FIRST AND SECOND SURFACES OPPOSITE FROM EACH OTHER, SECOND SUBSTRATE FACING FIRST SURFACE, AND DRIVE CIRCUIT FACING SECOND SURFACE

CROSS REFERENCE TO RELATED APPLICATION

This application is a continuation of U.S. patent application Ser. No. 15/996,754, filed Jun. 4, 2018, now U.S. Pat. No. 10,847,484, which claims priority from Japanese Patent Application No. 2017-192154 filed Sep. 29, 2017. The entire contents of the priority applications are incorporated herein by reference.

TECHNICAL FIELD

The present disclosure relates to an electronic device.

BACKGROUND

Electronic devices have been used extensively in various fields. One type of electronic device is known as a Micro Electro Mechanical Systems (MEMS) device, as represented by a liquid ejecting head (see Japanese Patent Application Publication No. 2017-124540, for example).

The MEMS device described in the Publication '540 includes a channel forming substrate provided with a plurality of driven elements (piezoelectric elements), a drive circuit (drive IC) that outputs signals for driving the plurality of driven elements, a drive circuit substrate in which are formed interconnects for relaying (i.e., establishing) electrical connections between the channel forming substrate and the drive circuit, and a plurality of through-substrate interconnects that penetrate the drive circuit substrate in the thickness direction thereof and are connected to a common electrode that is common to the plurality of driven elements.

SUMMARY

However, in the MEMS device described in the Publication '540, the through-substrate interconnect has a small cross-sectional area orthogonal to the thickness direction of the drive circuit substrate. As a result, the electrical path (i.e., the electrically-conducting path) connected to the common electrode has a high resistance, which may lead to irregularities in driving characteristics among the plurality of driven elements.

In view of the foregoing, it is an object of the present disclosure to provide an electronic device capable of suppressing irregularities in driving characteristics among the plurality of driven elements.

In order to attain the above and other objects, according to one aspect, the disclosure provides an electronic device including a first substrate, a second substrate, a plurality of driven elements, a drive circuit, a first interconnect, a second interconnect, a through-substrate interconnection part, a first bump part, and a second bump part. The first substrate has a first surface and a second surface opposite from the first surface. The first substrate has a thickness defining a thickness direction. The second substrate faces the first surface. The plurality of driven elements are provided at the second substrate and arrayed in a first direction orthogonal to the thickness direction. The drive circuit faces the second surface and is capable of outputting drive signals for driving the plurality of driven elements. The first interconnect is provided at the first surface and extends in the first direction. The second interconnect is provided at the second surface and extends in the first direction. The second interconnect is electrically connectable to a first external terminal. The through-substrate interconnection part penetrates the first substrate in the thickness direction and electrically connects the first interconnect and the second interconnect. The first bump part electrically connects the first interconnect and the plurality of driven elements. The second bump part electrically connects the second interconnect and the drive circuit. An electrical resistance of the through-substrate interconnection part is lower than an electrical resistance of the second bump part.

According to another aspect, the disclosure provides an electronic device including a first substrate, a second substrate, a plurality of driven elements, a drive circuit, a first interconnect, a second interconnect, a plurality of through-substrate interconnects, a plurality of first connection bumps, and a plurality of second connection bumps. The first substrate has a first surface and a second surface opposite from the first surface. The first substrate has a thickness defining a thickness direction. The second substrate faces the first surface. The plurality of driven elements are provided at the second substrate and arrayed in a first direction orthogonal to the thickness direction. The drive circuit faces the second surface and is capable of outputting drive signals for driving the plurality of driven elements. The first interconnect is provided at the first surface and extends in the first direction. The second interconnect is provided at the second surface and extends in the first direction. The second interconnect is electrically connectable to an external terminal. The plurality of through-substrate interconnects penetrate the first substrate in the thickness direction and electrically connect the first interconnect and the second interconnect. The plurality of first connection bumps electrically connect the first interconnect and the plurality of driven elements. The plurality of second connection bumps electrically connect the second interconnect and the drive circuit. A combined electrical resistance of the plurality of through-substrate interconnects is lower than a combined electrical resistance of the plurality of second connection bumps.

BRIEF DESCRIPTION OF THE DRAWINGS

The particular features and advantages of the disclosure will become apparent from the following description taken in connection with the accompanying drawings, in which.

DETAILED DESCRIPTION

Next, an electronic device according to an embodiment of the present disclosure will be described while referring to the accompanying drawings.

Figure 1:
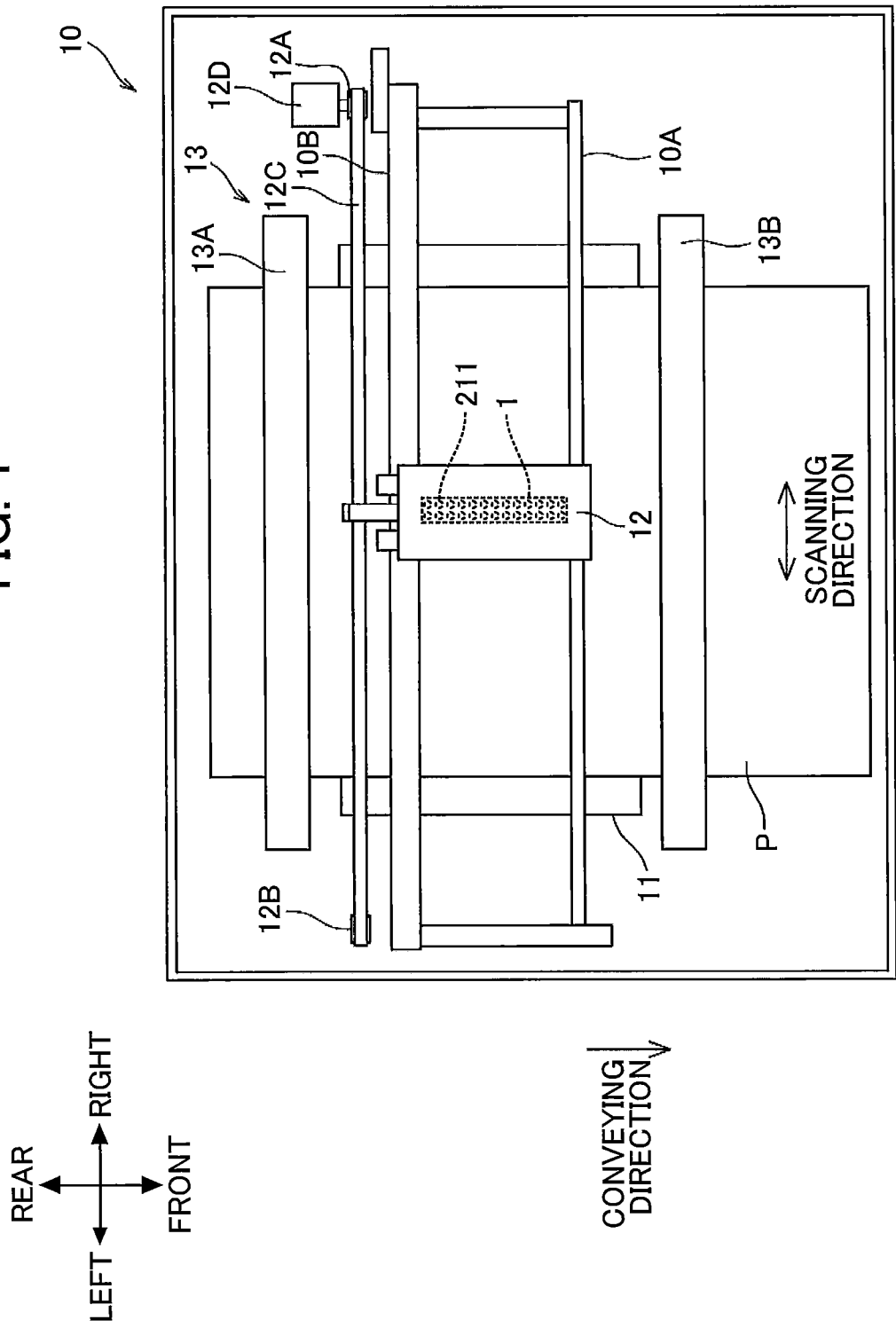
FIG. 1 is a schematic plan view of an inkjet printer provided with an inkjet head according to an embodiment of the present disclosure.

An inkjet printer 10 will be described with reference to FIG. 1. The inkjet printer 10 is provided with an inkjet head 1, which is an example of the electronic device according to the present embodiment. FIG. 1 is a schematic plan view of the inkjet printer 10. In the following description, the direction from the far side of FIG. 1 toward the near side will be defined as the upward direction, and the opposite direction thereto will be defined as the downward direction. The direction from the right side of FIG. 1 toward the left side will be defined as the leftward direction, and the opposite direction thereto will be defined as the rightward direction. The direction from the top of FIG. 1 toward the bottom will be defined as the forward direction, and the opposite direction thereto will be defined as the rearward direction. Further, terminology related to directions, such as up, down, left, right, front, and rear, will be used in the following description.

As illustrated in FIG. 1, the inkjet printer 10 includes the inkjet head 1, a platen 11, a carriage 12, and a conveying mechanism 13. The inkjet head 1 is a MEMS device.

A recording sheet P rests on the top surface of the platen 11. The recording sheet P is a recording medium. Two guide rails 10A and 10B are provided above the platen 11. The guide rails 10A and 10B extend parallel to a scanning direction (the left-right direction in the present embodiment).

The carriage 12 is capable of reciprocating in the scanning direction along the guide rails 10A and 10B. The carriage 12 is coupled to an endless belt 12C. The endless belt 12C is looped around two pulleys 12A and 12B. A carriage drive motor 12D drives the endless belt 12C to circulate about the pulleys 12A and 12B. When the endless belt 12C is driven to circulate, the carriage 12 moves along the scanning direction.

The inkjet head 1 is mounted in the carriage 12 and moves along with the carriage 12 in the scanning direction. An ink cartridge (not illustrated) mounted in the inkjet printer 10 is connected to the inkjet head 1 by a tube. A plurality of nozzles 211 (described later) are formed in the bottom surface of the inkjet head 1. Ink is supplied to the inkjet head 1 from the ink cartridge, and the inkjet head 1 ejects, from the nozzles 211, the supplied ink onto the recording sheet P placed on the platen 11. The inkjet head 1 will be described later in greater detail.

The conveying mechanism 13 has two conveying rollers 13A and 13B disposed on opposite sides of the platen 11 in the front-rear direction. A motor (not illustrated) drives the conveying rollers 13A and 13B to rotate. The conveying rollers 13A and 13B of the conveying mechanism 13 convey the recording sheet P on the platen 11 in a conveying direction (the forward direction in the present embodiment).

The inkjet printer 10 ejects ink from the inkjet head 1 toward the recording sheet P placed on the platen 11, while reciprocating the inkjet head 1 in the scanning direction together with the carriage 12. In parallel to this operation, the inkjet printer 10 conveys, using the conveying rollers 13A and 13B, the recording sheet P in the conveying direction. Through these operations, images, text, and the like are recorded on the recording sheet P.

Figure 2:
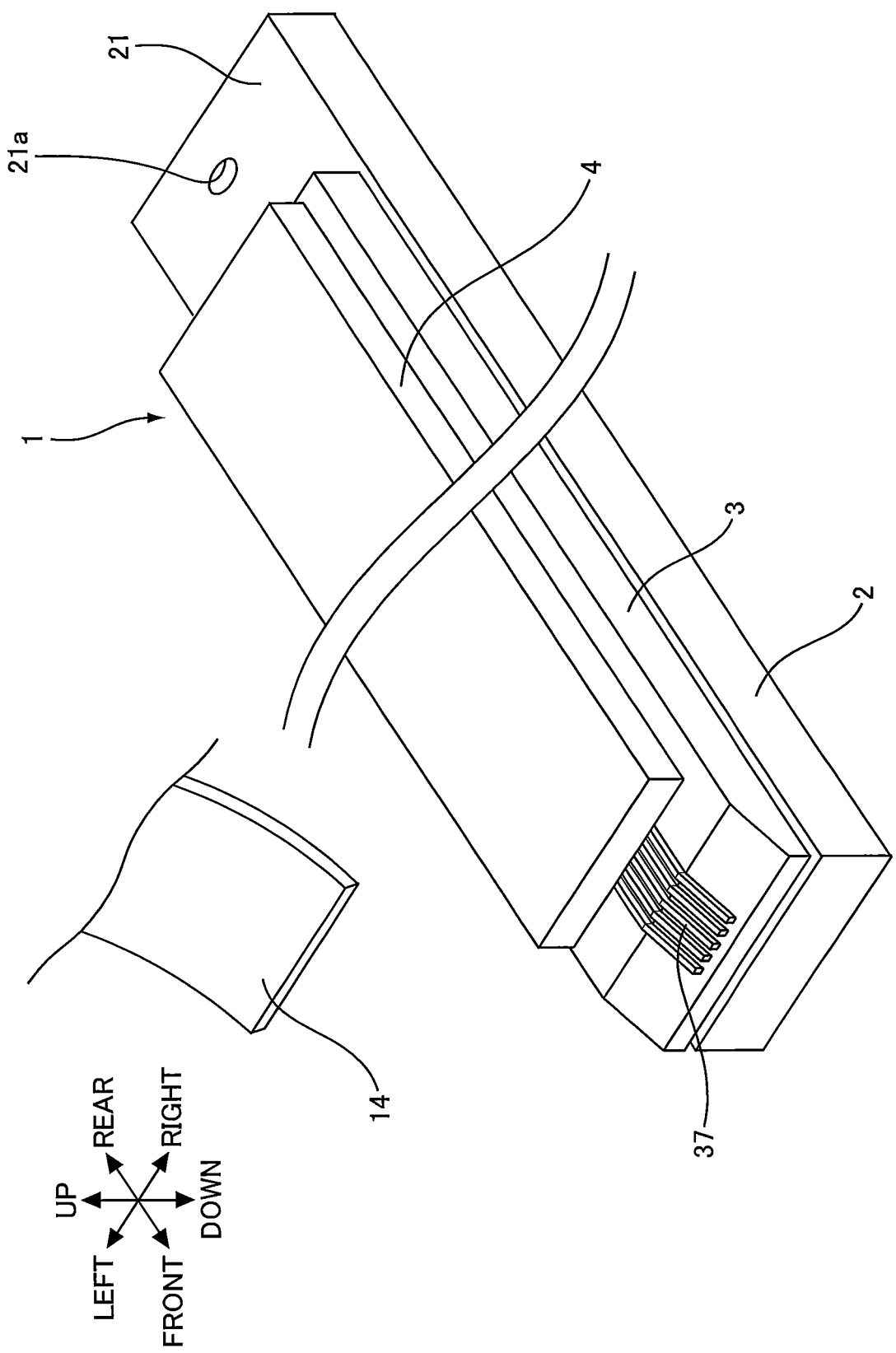
FIG. 2 is a perspective view of the inkjet head according to the embodiment of the present disclosure.
Figure 3:
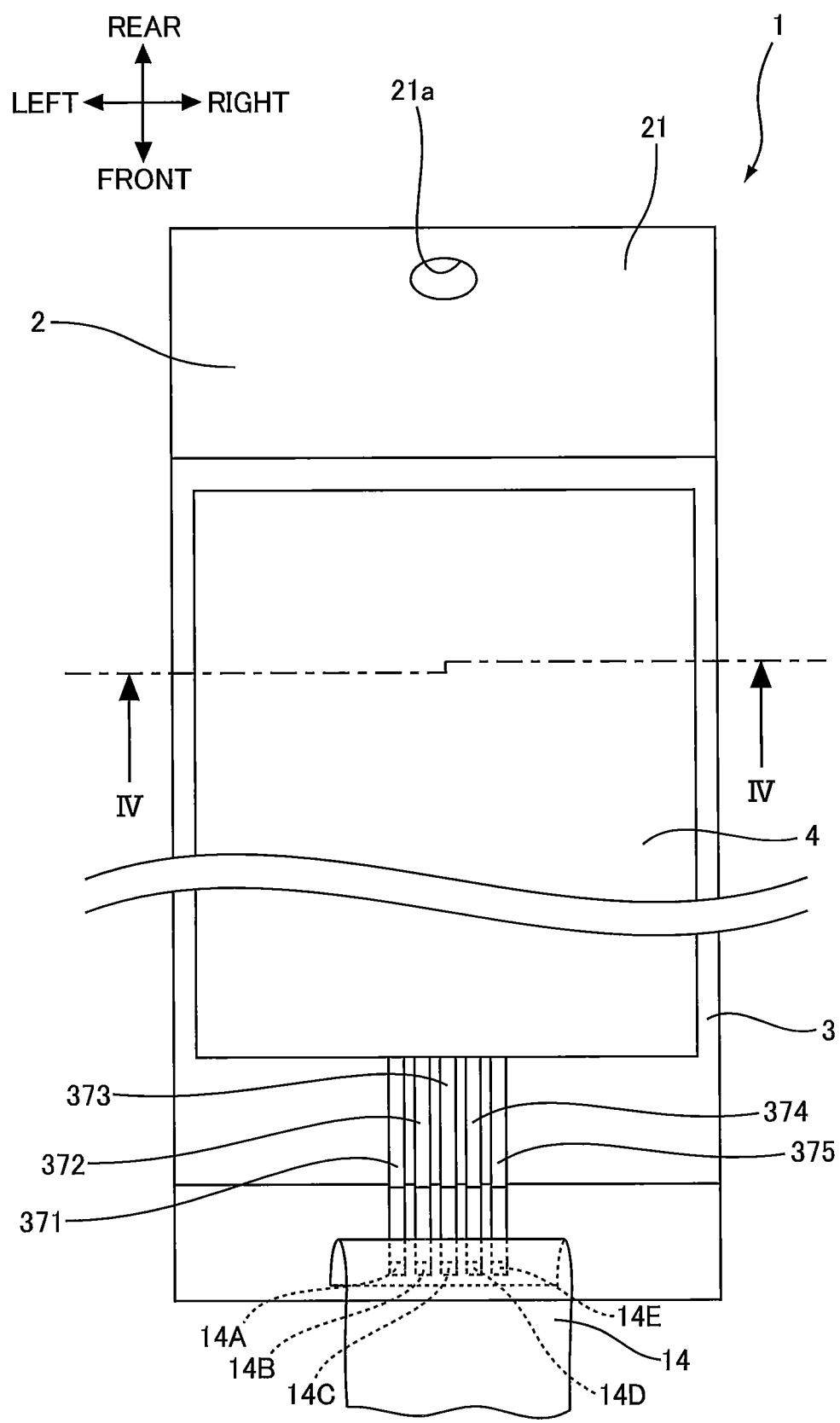
FIG. 3 is a plan view of the inkjet head according to the embodiment of the present disclosure.
Figure 4:
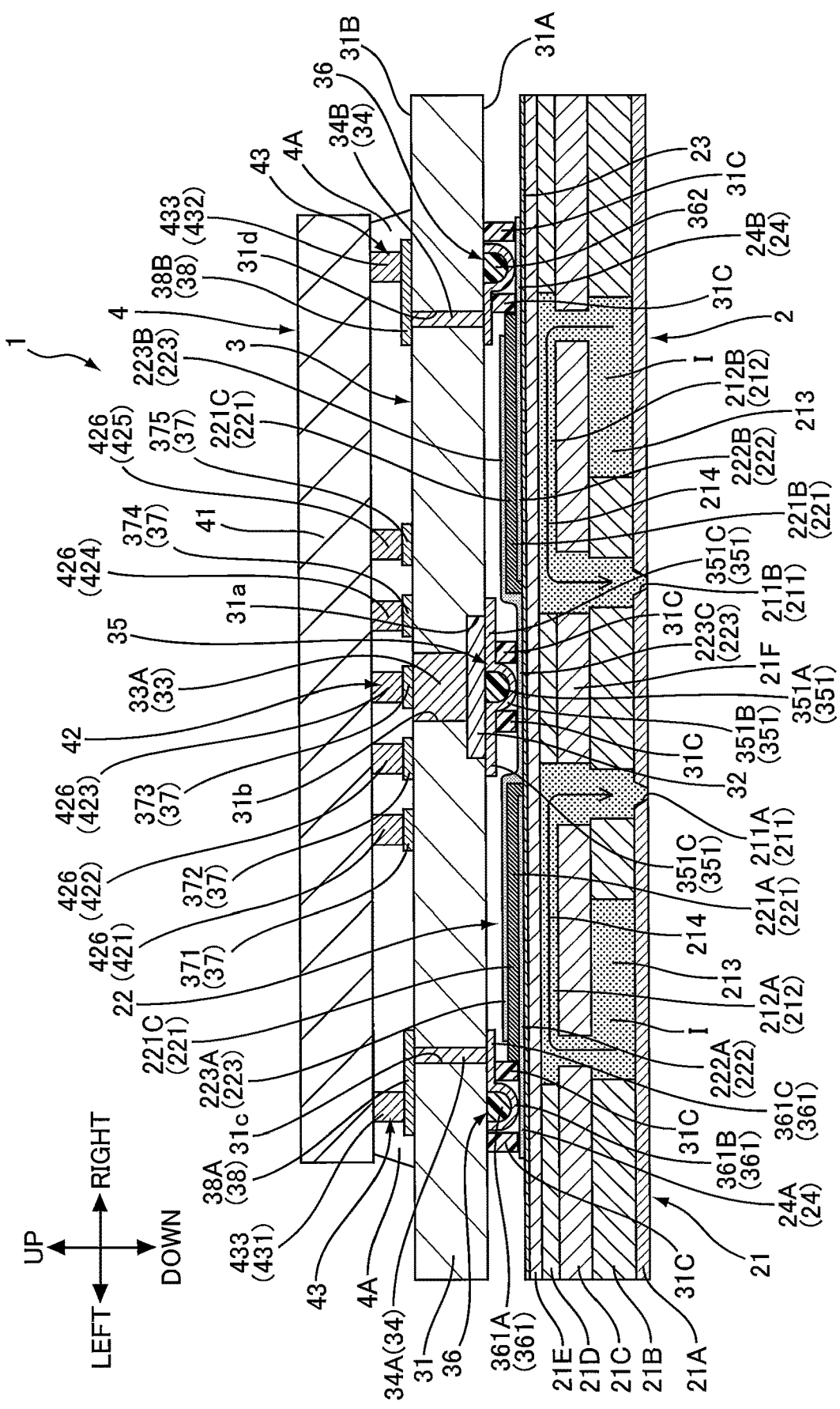
FIG. 4 is a cross-sectional view of the inkjet head taken along the line IV-IV in FIG. 3.

Next, the inkjet head 1 will be described in detail while referring to FIGS. 2 through 12. FIG. 2 is a perspective view of the inkjet head 1. FIG. 3 is a plan view of the inkjet head 1. FIG. 4 is a cross-sectional view of the inkjet head 1 taken along the line IV-IV in FIG. 3. Note that a portion of the inkjet head 1 along the longitudinal direction (front-rear direction) is omitted in FIGS. 2 and 3. The letter "I" in FIG. 4 denotes ink accommodated in the ink channels.

As illustrated in FIGS. 2 through 4, the inkjet head 1 is provided with a channel forming substrate part 2, a drive interconnection substrate part 3 bonded to the top surface of the channel forming substrate part 2, and a driver circuit part 4 bonded to the top surface of the drive interconnection substrate part 3. As illustrated in FIG. 3, the front end portion of the drive interconnection substrate part 3 is connected to a flexible cable 14 provided inside the inkjet printer 10.

As illustrated in FIG. 4, the channel forming substrate part 2 includes a channel forming substrate 21, and a piezoelectric actuator 22 provided at the channel forming substrate 21.

The channel forming substrate 21 includes five plates, namely, a nozzle plate 21A, a first plate 21B, a second plate 21C, a third plate 21D, and a vibration plate 21E, which are stacked in this order from bottom to top.

Each of the nozzle plate 21A, first plate 21B, second plate 21C, and third plate 21D is formed with a plurality of channel forming holes. These channel forming holes in the stacked five plates 21A-21E (i.e., in the channel forming substrate 21) communicates with each other to thereby form the ink channels (described later) in the channel forming substrate 21. In the present embodiment, the five plates 21A-21E are single-crystal silicon substrates, but the plates 21A-21E are not particularly limited to any material. For example, the plates 21A-21E may be metal plates formed of stainless steel, a nickel alloy steel, or the like.

Figure 5:
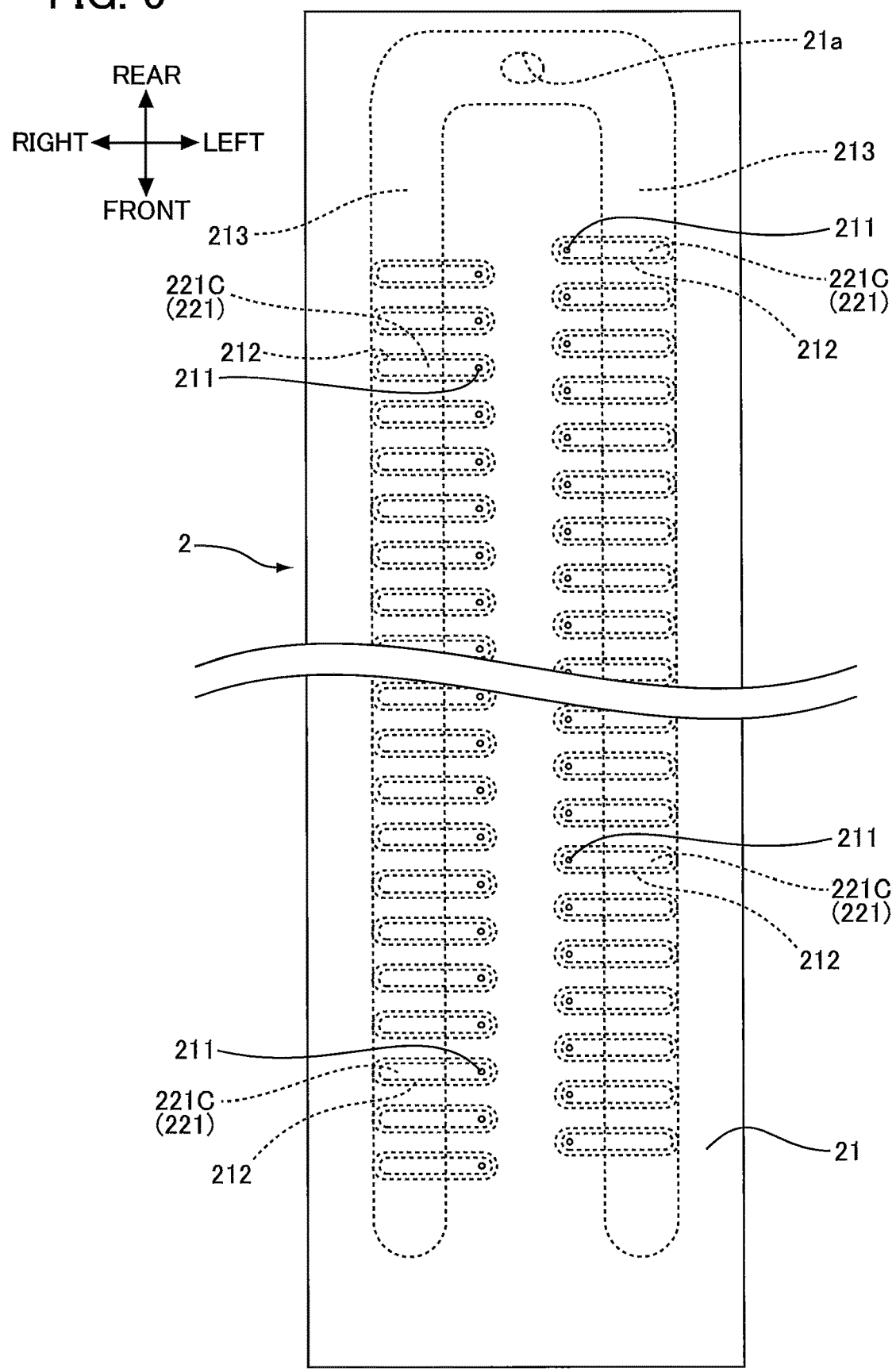
FIG. 5 is a bottom view of a channel forming substrate of the inkjet head according to the embodiment of the present disclosure.

As illustrated in FIGS. 2 and 3, an ink supply hole 21a is formed in the top surface of the channel forming substrate 21. The ink supply hole 21a is connected to the ink cartridge (not illustrated). As illustrated in FIG. 5, two manifolds 213 are formed inside the channel forming substrate part 2. FIG. 5 is a bottom view of the channel forming substrate 21. The manifolds 213 are elongated in the front-rear direction. The rear ends of the manifolds 213 communicate with the single ink supply hole 21*a*. Ink in the ink cartridge is supplied into the manifolds 213 through the ink supply hole 21*a*.

As illustrated in FIGS. 4 and 5, the plurality of nozzles 211 and a plurality of pressure chambers 212 are formed in one-to-one correspondence with each other in the channel forming substrate part 2. Each of the plurality of pressure chambers 212 is communicated with the corresponding nozzle 211.

The plurality of nozzles 211 are formed in the nozzle plate 21A, which is the bottommost layer of the channel forming substrate 21. The nozzles 211 are open in the bottom surface of the nozzle plate 21A (i.e., the bottom surface of the channel forming substrate 21). In the present embodiment, 400 (four hundred) nozzles 211 are formed in the nozzle plate 21A.

More specifically, half of the nozzles 211 are formed in the left portion of the channel forming substrate 21 and arrayed in the front-rear direction at regular intervals. The remaining half of the nozzles 211 are formed in the right portion of the channel forming substrate 21 and arrayed in the front-rear direction at regular intervals. In other words, two nozzle rows extending in the front-rear direction and juxtaposed with each other in the left-right direction are formed in the nozzle plate 21A, with half of the nozzles 211 belonging to the left nozzle row and the remaining half of the nozzles 211 belonging to the right nozzle row. In the present embodiment, 200 (two hundred) nozzles 211 belong to each of the left and right nozzle rows.

Further, the nozzles 211 in the two nozzle rows juxtaposed with each other in the left-right direction are arranged so as to be staggered, i.e., so that the positions of nozzles 211 in the left nozzle row are offset in the front-rear direction from the positions of nozzles 211 in the right nozzle row. In the following description, nozzles 211 belonging to the left nozzle row formed in the left portion of the channel forming substrate 21 will be called left nozzles 211A, while nozzles 211 belonging to the right nozzle row formed in the right portion of the channel forming substrate 21 will be called right nozzles 211B.

As illustrated in FIG. 5, each of the pressure chambers 212 have a general elliptical shape elongated in the left-right direction in a plan view. As illustrated in FIG. 4, the pressure chambers 212 are covered from above by the vibration plate 21E. As described above, the plurality of pressure chambers 212 are formed in one-to-one correspondence with the plurality of nozzles 211. In the present embodiment, 400 (four hundred) pressure chambers 212 are formed in the channel forming substrate part 2.

More specifically, half of the pressure chambers 212 are formed in the left portion of the channel forming substrate 21 in one-to-one correspondence with the left nozzles 211A and arrayed in the front-rear direction at regular intervals. The remaining half of the pressure chambers 212 are formed in the right portion of the channel forming substrate 21 in one-to-one correspondence with the right nozzles 211B and arrayed in the front-rear direction at regular intervals. In other words, two pressure chamber rows extending in the front-rear direction and juxtaposed with each other in the left-right direction are formed in the channel forming substrate 21, with half of the pressure chambers 212 belonging to the left pressure chamber row and the remaining half of the pressure chambers 212 belonging to the right pressure chamber row.

The pressure chambers 212 in the two pressure chamber rows juxtaposed with each other in the left-right direction are also arranged so as to be staggered, i.e., so that the positions of pressure chambers 212 in the left pressure chamber row are offset in the front-rear direction from the positions of pressure chambers 212 in the right pressure chamber row. In the following description, pressure chambers 212 belonging to the left pressure chamber row formed in the left portion of the channel forming substrate 21 will be called left pressure chambers 212A, while the pressure chambers 212 belonging to the right pressure chamber row formed in the right portion of the channel forming substrate 21 will be called right pressure chambers 212B.

Each of the pressure chambers 212 is in communication with the corresponding nozzle 211 at the inner end in the left-right direction of the pressure chamber 212. More specifically, each of the right ends of the left pressure chambers 212A is in communication with the corresponding left nozzle 211A, and each of the left ends of the right pressure chambers 212B is in communication with the corresponding right nozzle 211B.

Each of the left pressure chambers 212A is arranged at a position overlapping the left manifold 213 in a plan view, and each of the right pressure chambers 212B is arranged at a position overlapping the right manifold 213 in a plan view. Each of the pressure chambers 212 is in communication with the manifold 213 positioned directly therebeneath.

A plurality of individual ink channels 214 are formed in the channel forming substrate 21. Each individual ink channel 214 branches off from the corresponding manifold 213 and passes through the corresponding pressure chamber 212 to arrive at the corresponding nozzle 211.

Next, the piezoelectric actuator 22 will be described. As illustrated in FIG. 4, the piezoelectric actuator 22 is disposed at the top surface of the vibration plate 21E. The piezoelectric actuator 22 has two piezoelectric materials 221 (a left piezoelectric material 221A and a right piezoelectric material 221B), a plurality of drive electrodes 222 to which drive voltages (described later) are applied from the driver circuit part 4, and a common electrode 223 to which a bias voltage (described later) is applied from the flexible cable 14.

As illustrated in FIG. 4, an insulating layer 23 is formed over substantially the entire top surface of the vibration plate 21E. In the present embodiment, the insulating layer 23 is formed of an insulating material, such as a synthetic resin material. The two piezoelectric materials 221, namely, the left piezoelectric material 221A and right piezoelectric material 221B, are disposed on the top surface of the vibration plate 21E covered by the insulating layer 23. Each of the left piezoelectric material 221A and right piezoelectric material 221B has a rectangular shape elongated in the front-rear direction in a plan view.

The left piezoelectric material 221A and right piezoelectric material 221B are arranged parallel to each other, with the left piezoelectric material 221A covering the left pressure chamber row and the right piezoelectric material 221B covering the right pressure chamber row.

The left piezoelectric material 221A and right piezoelectric material 221B are formed of a piezoelectric material whose primary component is lead zirconate titanate (PZT). PZT is a ferroelectric solid solution of lead titanate and lead zirconate. Note that the left piezoelectric material 221A and right piezoelectric material 221B can be formed directly on the top surface of the vibration plate 21E covered by the insulating layer 23 through a well-known film formation technique, such as a sputtering method or a sol-gel method. Alternatively, the left piezoelectric material 221A and right piezoelectric material 221B may be formed by firing a thin green sheet and pasting the thin green sheet to the vibration plate 21E.

The drive electrodes 222 are provided between the bottom surface of the piezoelectric material 221 and the top surface of the insulating layer 23 in one-to-one correspondence with the plurality of pressure chambers 212. In the present embodiment, the piezoelectric actuator 22 has 400 drive electrodes 222.

Specifically, half of the drive electrodes 222 are provided at the left portion of the channel forming substrate 21 in one-to-one correspondence with the left pressure chambers 212A and arrayed in the front-rear direction at regular intervals. The remaining half of the drive electrodes 222 are provided at the right portion of the channel forming substrate 21 in one-to-one correspondence with the right pressure chambers 212B and arrayed in the front-rear direction at regular intervals.

Each of the drive electrodes 222 has a general elliptical shape in a plan view that is smaller than the pressure chamber 212. Each of the drive electrodes 222 is arranged so as to face the substantial center portion of the corresponding pressure chamber 212. Each of the drive electrodes 222 is electrically insulated from the vibration plate 21E by the insulating layer 23. In the following description, the drive electrodes 222 disposed in one-to-one correspondence with the left pressure chambers 212A will be called the left drive electrodes 222A, and the drive electrodes 222 disposed in one-to-one correspondence with the right pressure chambers 212B will be called the right drive electrodes 222B.

A drive terminal 24 extending in the left-right direction is electrically connected to each drive electrode 222. In the present embodiment, 400 (four hundred) drive terminals 24 are provided in the channel forming substrate part 2. On the insulating layer 23, each of the drive terminals 24 extends in a direction away from the nozzle 211 (in a direction toward the outer side) from the corresponding drive electrode 222 to a region that does not face the pressure chamber 212. Thus, the drive terminals 24 are exposed on the outside of the piezoelectric materials 221, as illustrated in FIG. 4.

More specifically, half of the drive terminals 24 are provided leftward of the left piezoelectric materials 221A in one-to-one correspondence with the left drive electrodes 222A and arrayed in the front-rear direction at regular intervals. The remaining half of the drive terminals 24 are provided rightward of the right piezoelectric materials 221B in one-to-one correspondence with the right drive electrodes 222B and arrayed in the front-rear direction at regular intervals. In the following description, the drive terminals 24 disposed in one-to-one correspondence with the left drive electrodes 222A will be called left drive terminals 24A, and the drive terminals 24 disposed in one-to-one correspondence with the right drive electrodes 222B will be called right drive terminals 24B.

The common electrode 223 is provided across both piezoelectric materials 221 so as to cover substantially the entire top surfaces of the piezoelectric materials 221. Specifically, the common electrode 223 has a left electrode portion 223A, a right electrode portion 223B, and a connecting electrode portion 223C.

The left electrode portion 223A is formed over substantially the entire top surface of the left piezoelectric material 221A, and the right electrode portion 223B is formed over substantially the entire top surface of the right piezoelectric material 221B.

The connecting electrode portion 223C is formed in the region between the two piezoelectric materials 221. In other words, the connecting electrode portion 223C is disposed at a region on the top surface of the vibration plate 21E which region does not face the pressure chambers 212. More specifically, the connecting electrode portion 223C faces a partitioning portion 21F of the channel forming substrate part 2. The partitioning portion 21F is a wall portion that partitions the left pressure chamber row from the right pressure chamber row.

The connecting electrode portion 223C extends in the front-rear direction along the long sides of the two piezoelectric materials 221, which are rectangular shapes elongated in the front-rear direction. The connecting electrode portion 223C is electrically insulated from the vibration plate 21E by the insulating layer 23. The connecting electrode portion 223C is formed on the top surface of the vibration plate 21E at a position lower than the left electrode portion 223A and right electrode portion 223B formed on the top surfaces of the piezoelectric materials 221. Accordingly, as illustrated in FIG. 4, the common electrode 223 is partially recessed downward. That is, the common electrode 223 is recessed at the connecting electrode portion 223C.

As illustrated in FIGS. 4 and 5, the piezoelectric materials 221 has portions interposed between the common electrode 223 and the drive electrodes 222. Hereinafter, the portions of the piezoelectric materials 221 are also called "piezoelectric elements 221C." Each of the piezoelectric elements 221C, when a drive voltage is applied to the corresponding drive electrode 222, deforms and applies ejection energy to ink inside the corresponding pressure chambers 212. In the present embodiment, one piezoelectric material 221 is arranged across the pressure chambers 212 belonging to one pressure chamber row, and the piezoelectric elements 221C corresponding to the pressure chambers 212 in this row are integrally configured. In addition, each of the piezoelectric elements 221C is polarized in the thickness direction thereof. In the present embodiment, the piezoelectric actuator 22 has 400 (four hundred) piezoelectric elements 221C.

When the driver circuit part 4 applies a drive voltage to one of the drive electrodes 222, an electric potential difference is produced between the drive electrode 222 and the common electrode 223 to which a bias voltage is applied. Consequently, an electric field along the thickness direction is applied to the portion of the piezoelectric material 221 between the drive electrode 222 and common electrode 223 (i.e., the piezoelectric element 221C). Since the direction of this electric field is parallel to the direction of polarization in the piezoelectric element 221C, the piezoelectric element 221C expands in its thickness direction and contracts along its planar direction. This expansion of the piezoelectric element 221C in its thickness direction forces the vibration plate 21E, which covers the pressure chamber 212, to warp into a convex shape toward the pressure chamber 212, thereby decreasing the capacity of the pressure chamber 212. As a result, pressure (ejection energy) is applied to the ink in the pressure chamber 212, so that an ink droplet is ejected from the corresponding nozzle 211.

Figure 6:
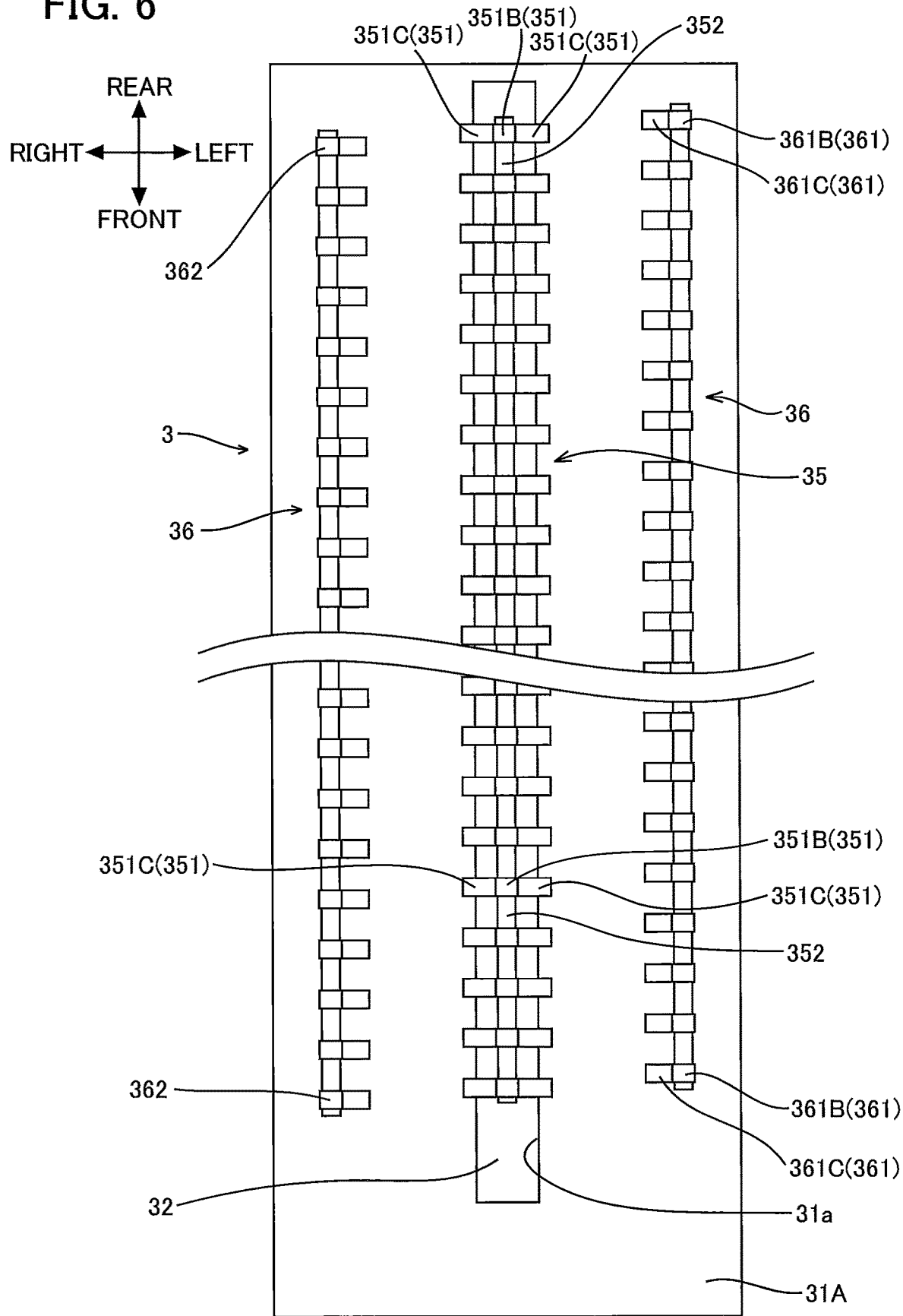
FIG. 6 is a bottom view of a drive interconnection substrate part of the inkjet head according to the embodiment of the present disclosure.
Figure 9:
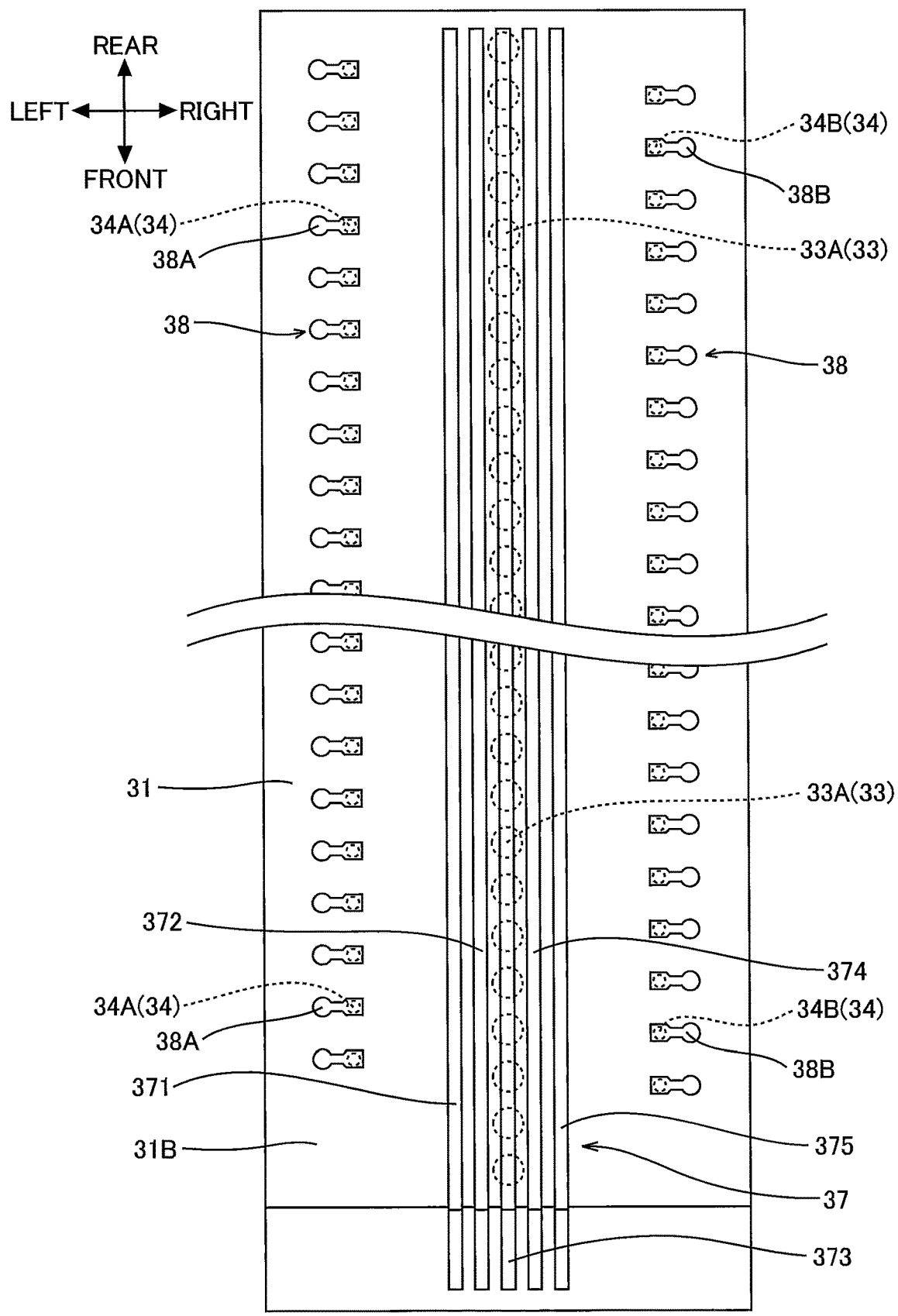
FIG. 9 is a plan view of a drive interconnection substrate of the inkjet head according to the embodiment of the present disclosure.

Next, the drive interconnection substrate part 3 will be described. As illustrated in FIGS. 4, 6, and 9, the drive interconnection substrate part 3 has a drive interconnection substrate 31, an embedded common interconnect 32, a common through-substrate interconnection part 33, individual through-substrate interconnection part 34, a center bump part 35, an individual bump part 36, a feed interconnection part 37, and an individual interconnection part 38.

The drive interconnection substrate 31 is a substrate elongated in the front-rear direction and formed of the same material as the five plates 21A-21E described above. The drive interconnection substrate 31 is positioned between the driver circuit part 4 and channel forming substrate part 2 in the thickness direction of the drive interconnection substrate 31 (i.e., the up-down direction).

As illustrated in FIG. 4, the drive interconnection substrate 31 is bonded to the channel forming substrate 21 using a photosensitive adhesive 31C, with the center bump part 35 and individual bump part 36 being interposed between the drive interconnection substrate 31 and channel forming substrate 21. The photosensitive adhesive 31C has both a thermosetting property and photosensitivity. In the present embodiment, the drive interconnection substrate 31 is a single-crystal silicon substrate.

The drive interconnection substrate 31 has a bottom surface 31A facing the channel forming substrate 21 of the channel forming substrate part 2, and a top surface 31B facing the driver circuit part 4. The drive interconnection substrate 31 is formed with a recessed part 31a, a plurality of central through-holes 31b, a plurality of left through-holes 31c, and a plurality of right through-holes 31d.

As illustrated in FIGS. 4 and 6, the recessed part 31a is formed in the bottom surface 31A of the drive interconnection substrate 31 at the left-right center thereof. The recessed part 31a is depressed upward and elongated in the front-rear direction. A cross-section of the recessed part 31a orthogonal to the front-rear direction has a rectangular shape that is elongated in the left-right direction. FIG. 6 is a bottom view of the drive interconnection substrate part 3.

Figure 7:
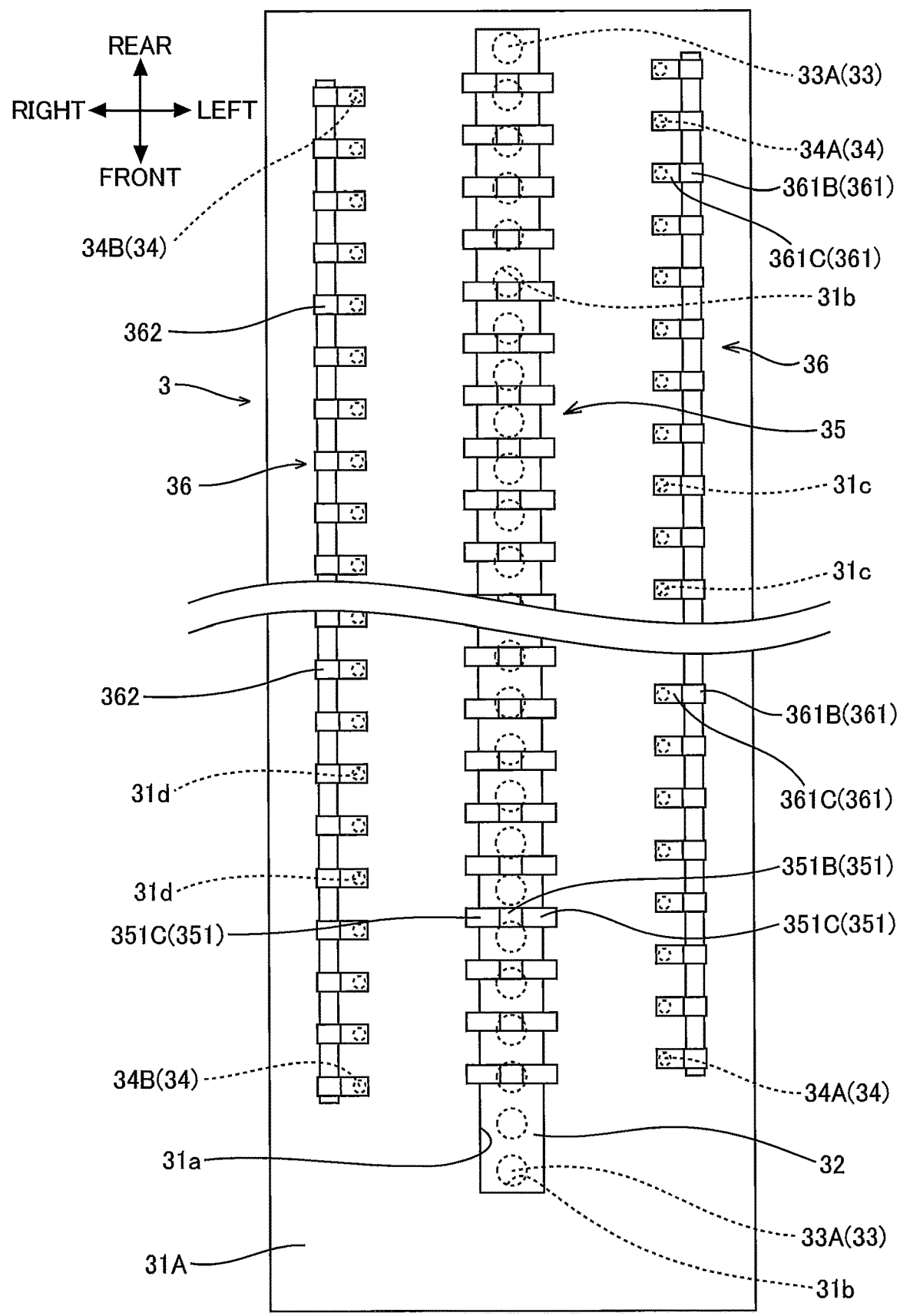
FIG. 7 is the bottom view of the drive interconnection substrate part of the inkjet head according to the embodiment of the present disclosure, in which core-connecting portions of a center bump part have been omitted.

As illustrated in FIGS. 4 and 7, each of the central through-holes 31b is substantially circular in a plan view and penetrates the drive interconnection substrate 31 in the thickness direction of the same (the up-down direction in the present embodiment). The top open end of each central through-hole 31b is open in the top surface of the drive interconnection substrate 31, while the bottom open end of each central through-hole 31b is open in the recessed part 31a. The central through-holes 31b are formed in the left-right center of the drive interconnection substrate 31 and arrayed in the front-rear direction at regular intervals. In the present embodiment, the drive interconnection substrate 31 is formed with 300 (three hundred) central through-holes 31b. FIG. 7 is the bottom view of the drive interconnection substrate part 3, in which core-connecting portions 352 (described later) of the center bump part 35 illustrated in FIG. 6 have been omitted. Further, the central through-holes 31b, left through-holes 31c, and right through-holes 31d, are depicted with dashed lines in FIG. 7.

Each of the left through-holes 31c is substantially circular in shape in a plan view and penetrates the drive interconnection substrate 31 in the thickness direction thereof (the up-down direction in the present embodiment). The left through-holes 31c are formed in one-to-one correspondence with the left drive terminals 24A.

Specifically, the left through-holes 31c are formed in the left portion of the drive interconnection substrate 31 and arrayed in the front-rear direction at fixed intervals. The number of the left through-holes 31c is the same as that of the left drive terminals 24A. The position in the front-rear direction of each the left through-hole 31c is coincident with that of the corresponding left drive terminal 24A. The correspondence and positional relationships between the right through-holes 31d and right drive terminals 24B are identical to the correspondence and positional relationships between the left through-holes 31c and left drive terminals 24A. Therefore, a detailed description of the right through-holes 31d will be omitted. In the present embodiment, the drive interconnection substrate 31 is formed with 200 (two hundred) left through-holes 31c and 200 (two hundred) right through-holes 31d.

The embedded common interconnect 32 is embedded in the recessed part 31a and extends in the front-rear direction. The front-rear length of the embedded common interconnect 32 is longer than the front-rear length of each of the pressure chamber rows. The front end of the embedded common interconnect 32 is positioned farther forward than the front end of each of the pressure chamber rows, and the rear end of the embedded common interconnect 32 is positioned farther rearward than the rear end of each of the pressure chamber rows. The embedded common interconnect 32 is formed by filling the recessed part 31a with an electrically conductive material such as copper (Cu) or another metal. The embedded common interconnect 32 may be formed through a method of electroplating, electroless plating, or printing of electrically conductive paste, for example.

The common through-substrate interconnection part 33 penetrates the drive interconnection substrate 31 in the thickness direction thereof (the up-down direction in the present embodiment) and electrically connects the embedded common interconnect 32 and the feed interconnection part 37. More specifically, the common through-substrate interconnection part 33 includes a plurality of common through-substrate interconnects 33A and electrically connects the embedded common interconnect 32 and a third feed interconnect 373 (described later) of the feed interconnection part 37.

The common through-substrate interconnects 33A are formed by filling the plurality of central through-holes 31b with an electrically conductive material such as copper (Cu) or another metal. The common through-substrate interconnects 33A are provided at the left-right center of the drive interconnection substrate 31 and arrayed in the front-rear direction at regular intervals. The number of the common through-substrate interconnects 33A is the same as that of the central through-holes 31b.

Each common through-substrate interconnect 33A penetrates the drive interconnection substrate 31 in the thickness direction of the same. The bottom end of each common through-substrate interconnect 33A contacts and is electrically connected to the embedded common interconnect 32, while the top end of each common through-substrate interconnect 33A contacts and is electrically connected to the feed interconnection part 37. More specifically, the top end of each common through-substrate interconnect 33A contacts and is electrically connected to the third feed interconnect 373 (described later) of the feed interconnection part 37. As with the embedded common interconnect 32 described above, the common through-substrate interconnects 33A may be formed by electroplating, electroless plating, or the like. Note that the common through-substrate interconnects 33A and the embedded common interconnect 32 may be simultaneously and integrally formed. Such a method can simplify the manufacturing process and reduce manufacturing costs. In the present embodiment, the common through-substrate interconnection part 33 includes 300 (three hundred) common through-substrate interconnects 33A.

The individual through-substrate interconnection part 34 electrically connects the individual bump part 36 to the individual interconnection part 38. The individual through-substrate interconnection part 34 include a plurality of left through-substrate interconnects 34A, and a plurality of right through-substrate interconnects 34B.

The left through-substrate interconnects 34A are provided at the left portion of the drive interconnection substrate 31 in one-to-one correspondence with the left drive terminals 24A and arrayed in the front-rear direction at regular intervals. The left through-substrate interconnects 34A are identical in number to the left through-holes 31c. The left through-substrate interconnects 34A are formed by filling the left through-holes 31c with an electrically conductive material such as copper (Cu) or another metal. Each of the left through-substrate interconnects 34A penetrates the drive interconnection substrate 31 in the thickness direction of the same.

Note that the correlations and positional relationships of the right through-substrate interconnects 34B, the right through-holes 31d, and the right drive terminals 24B are identical to the correlations and positional relationships of the left through-substrate interconnects 34A, the left through-holes 31c, and the left drive terminals 24A. Accordingly, a detailed description of the right through-holes 31d will not be included herein. In the present embodiment, the individual through-substrate interconnection part 34 include 200 (two hundred) left through-substrate interconnects 34A and 200 (two hundred) right through-substrate interconnects 34B.

As illustrated in FIGS. 4, 6, and 7, the center bump part 35 is electrically connects the embedded common interconnect 32 to the piezoelectric elements 221C of the piezoelectric actuator 22. The center bump part 35 is provided on the bottom surface 31A of the drive interconnection substrate 31. The center bump part 35 includes a plurality of center connection bumps 351, and the plurality of core-connecting portions 352.

As illustrated in FIGS. 6 and 7, the center connection bumps 351 are provided at the left-right right center of the bottom surface 31A of the drive interconnection substrate 31 and arrayed in the front-rear direction at regular intervals. In the present embodiment, the center bump part 35 includes 200 (two hundred) center connection bumps 351. Each center connection bump 351 electrically connects the embedded common interconnect 32 to the connecting electrode portion 223C of the common electrode 223. That is, each center connection bump 351 electrically connects the embedded common interconnect 32 to the plurality of piezoelectric elements 221C through the common electrode 223. In the present embodiment, the number of center connection bumps 351 is identical to both the number of left through-substrate interconnects 34A and the number of right through-substrate interconnects 34B. The plurality of center connection bumps 351 is an example of a plurality of first connection bumps.

Figure 8:
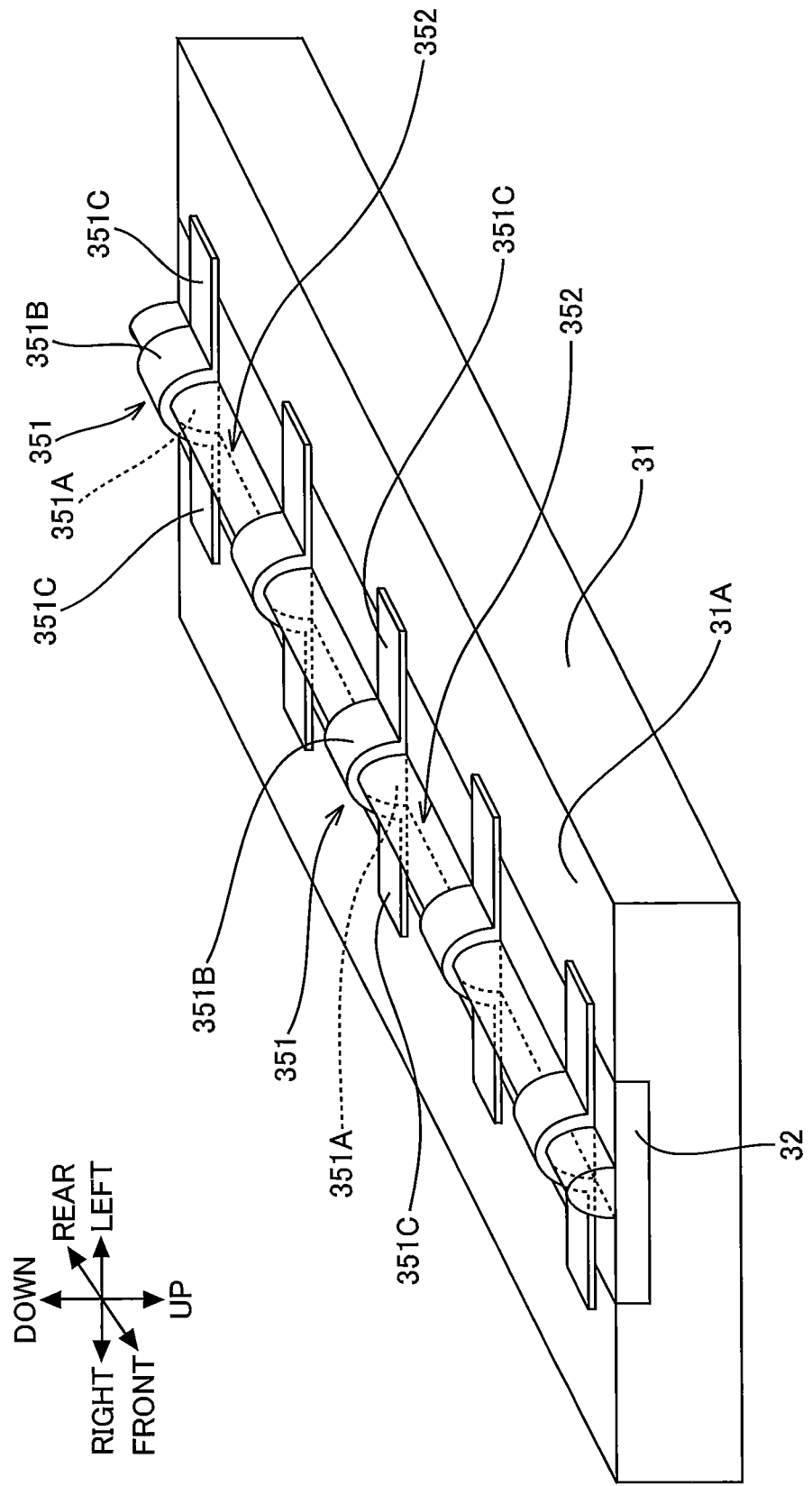
FIG. 8 is a perspective view illustrating center connection bumps and the core-connecting portions of the inkjet head according to the embodiment of the present disclosure.

Here, the center connection bumps 351 will be described in greater detail with reference to FIG. 8. FIG. 8 is a perspective view illustrating the center connection bumps 351 and the core-connecting portions 352. As illustrated in FIG. 8, each center connection bump 351 has a core portion 351A, a cover portion 351B, and two extension portions 351C.

The core portion 351A has a semicircular or semi-elliptical shape in a front view that is downwardly convex. The core portion 351A has a prescribed dimension in the front-rear direction. More specifically, the core portion 351A has a top surface in contact with the embedded common interconnect 32, and an outer surface that curves to form a downwardly convex shape. The outer surface of the core portion 351A connects the left edge and right edge of the top surface. The core portions 351A are formed of an elastic resin material that is a photosensitive insulating resin or a thermosetting insulating resin such as polyimide resin, acrylic resin, phenolic resin, silicone resin, silicone-modified polyimide resin, or epoxy resin.

The cover portion 351B is an electrically conductive member. The cover portion 351B curves along the outer surface of the core portion 351A so as to be downwardly convex and covers the outer surface of the core portion 351A. The bottom end portion of the cover portion 351B contacts and is electrically connected to the connecting electrode portion 223C of the common electrode 223. The left and right top end portions of the cover portion 351B contact and are electrically connected to the embedded common interconnect 32. Note that since the drive interconnection substrate 31 and channel forming substrate 21 are pressed toward each other when they are bonded together, the cover portions 351B and core portions 351A are elastically deformed so that the shapes of their distal ends conform to the surface shape of the connecting electrode portion 223C constituting the common electrode 223.

The two extension portions 351C are electrically conductive members and are integrally formed with the cover portion 351B. One of the extension portions 351C extends leftward from the upper left end of the cover portion 351B, and the other extension portion 351C extends rightward from the upper right end of the cover portion 351B. Each extension portion 351C has a portion that is in contact with and electrically connected to the embedded common interconnect 32.

Each core-connecting portion 352 extends in the front-rear direction between two core portions 351A neighboring each other in the front-rear direction and connects the two neighboring core portions 351A. In the present embodiment, the core-connecting portions 352 are formed of the same resin material as the core portions 351A and are integrally formed with the core portions 351A. In other words, every two core portions 351A that neighbor each other in the front-rear direction are formed integrally with each other through a single core-connecting portion 352.

As illustrated in FIG. 4, the individual bump part 36 includes a plurality of left connection bumps 361 that electrically connect the left through-substrate interconnects 34A to the left drive terminals 24A, and a plurality of right connection bumps 362 that electrically connect the right through-substrate interconnects 34B to the right drive terminals 24B.

As illustrated in FIGS. 4, 6 and 7, the left connection bumps 361 are provided in one-to-one correspondence with the left drive terminals 24A and are arrayed in the front-rear direction at regular intervals. Each left connection bump 361 electrically connects the corresponding left drive terminal 24A to the corresponding left through-substrate interconnect 34A.

Specifically, each left connection bump 361 has a core portion 361A, a cover portion 361B, and an extension portion 361C. The core portion 361A, cover portion 361B, and extension portion 361C are formed of the same material and in the same shape as the respective core portion 351A, cover portion 351B, and extension portion 351C of the center connection bump 351. The core portion 361A and cover portion 361B of each left connection bump 361 are positioned leftward of the corresponding left through-substrate interconnect 34A and directly above the corresponding left drive terminal 24A.

The bottom end portion of the cover portion 361B is in contact with and electrically connected to the corresponding left drive terminal 24A. The extension portion 361C is in contact with and electrically connected to the bottom end of the corresponding left through-substrate interconnect 34A. Note that since the drive interconnection substrate 31 and channel forming substrate 21 are pressed toward each other when they are bonded together, the cover portion 361B and core portion 361A are elastically deformed so that the shapes of their distal ends conform with the surface shape of the corresponding left drive terminals 24A.

The right connection bumps 362 are provided in one-to-one correspondence with the right drive terminals 24B and arrayed in the front-rear direction at regular intervals. A core portion and a cover portion of each right connection bump 362 are positioned rightward of the corresponding right through-substrate interconnect 34B and directly above the corresponding right drive terminals 24B. Each of the right connection bumps 362 electrically connects the corresponding right drive terminal 24B to the corresponding right through-substrate interconnect 34B. Since the right connection bumps 362 are the same members as the left connection bumps 361, a detailed description of the right connection bumps 362 will not be included herein. In the present embodiment, the individual bump part 36 includes 200 (two hundred) left connection bumps 361 and 200 (two hundred) right connection bumps 362.

The feed interconnection part 37 is an interconnection part for supplying, to the driver circuit part 4 and the common electrode 223 of the piezoelectric actuator 22, various voltages or signals outputted from the flexible cable 14. The feed interconnection part 37 includes a first feed interconnect 371, a second feed interconnect 372, a third feed interconnect 373, a fourth feed interconnect 374, and a fifth feed interconnect 375. Although not explicitly illustrated in the drawings, the flexible cable 14 is connected to control elements such as control circuits provided inside the inkjet printer 10.

As illustrated in FIG. 9, the first feed interconnect 371, second feed interconnect 372, third feed interconnect 373, fourth feed interconnect 374, and fifth feed interconnect 375 are provided on the top surface 31B of the drive interconnection substrate 31 in this order from left to right and extend in the front-rear direction. FIG. 9 is a plan view of the drive interconnection substrate 31.

As illustrated in FIG. 3, the flexible cable 14 has terminals 14A, 14B, 14C, 14D, and 14E. The front end portions of the first feed interconnect 371, second feed interconnect 372, third feed interconnect 373, fourth feed interconnect 374, and fifth feed interconnect 375 are electrically connected to the terminal 14A, terminal 14B, terminal 14C, terminal 14D, and terminal 14E of the flexible cable 14, respectively. That is, the first feed interconnect 371, second feed interconnect 372, third feed interconnect 373, fourth feed interconnect 374, and fifth feed interconnect 375 are electrically connectable to the terminal 14A, terminal 14B, terminal 14C, terminal 14D, and terminal 14E, respectively.

In the present embodiment, a power source voltage serving as the power source of the driver circuit part 4 is applied to the first feed interconnect 371 through the terminal 14A, a drive voltage (drive signal) for driving the piezoelectric elements 221C is applied to the second feed interconnect 372 through the terminal 14B, a bias voltage (Vbs) to be applied to the connecting electrode portion 223C of the common electrode 223 is supplied to the third feed interconnect 373 through the terminal 14C, control signals for controlling the driver circuit part 4 is supplied to the fourth feed interconnect 374 through the terminal 14D, and a ground voltage (GND voltage) is applied to the fifth feed interconnect 375 through the terminal 14E.

As illustrated in FIGS. 4 and 9, the bottom surface of the third feed interconnect 373 to which the bias voltage (Vbs) is applied is in contact with the common through-substrate interconnection part 33 and, hence, the third feed interconnect 373 is electrically connected to the common through-substrate interconnection part 33. More specifically, the bottom surface of the third feed interconnect 373 is in contact with the top end of each common through-substrate interconnect 33A, and thus the third feed interconnect 373 and the common through-substrate interconnection part 33 are electrically connected to each other. The above-described bias voltage is applied from the terminal 14C of the flexible cable 14 to the common electrode 223 of the piezoelectric actuator 22 through the third feed interconnect 373, the common through-substrate interconnects 33A, the embedded common interconnect 32, and the center connection bumps 351.

As illustrated in FIGS. 4 and 9, the individual interconnection part 38 is electrically connected to the individual through-substrate interconnection part 34. The individual interconnection part 38 includes a plurality of left individual interconnects 38A, and a plurality of right individual interconnects 38B.

As illustrated in FIG. 9, the left individual interconnects 38A are provided in one-to-one correspondence with the left through-substrate interconnects 34A. The left individual interconnects 38A are disposed at the top surface 31B of the drive interconnection substrate 31 in the left portion thereof and arrayed in the front-rear direction at regular intervals. Each of the left individual interconnects 38A extends in the left-right direction. The right end portion of each left individual interconnect 38A is electrically connected to the corresponding left through-substrate interconnect 34A.

The right individual interconnects 38B are provided in one-to-one correspondence with the right through-substrate interconnects 34B. The right individual interconnects 38B are disposed at the top surface 31B of the drive interconnection substrate 31 in the right portion thereof and arrayed in the front-rear direction at regular intervals. Each of the right individual interconnects 38B extends in the left-right direction. The left end portion of each right individual interconnect 38B is electrically connected to the corresponding right through-substrate interconnect 34B. In the present embodiment, the individual interconnection part 38 includes 200 (two hundred) left individual interconnects 38A and 200 (two hundred) right individual interconnects 38B.

Figure 10:
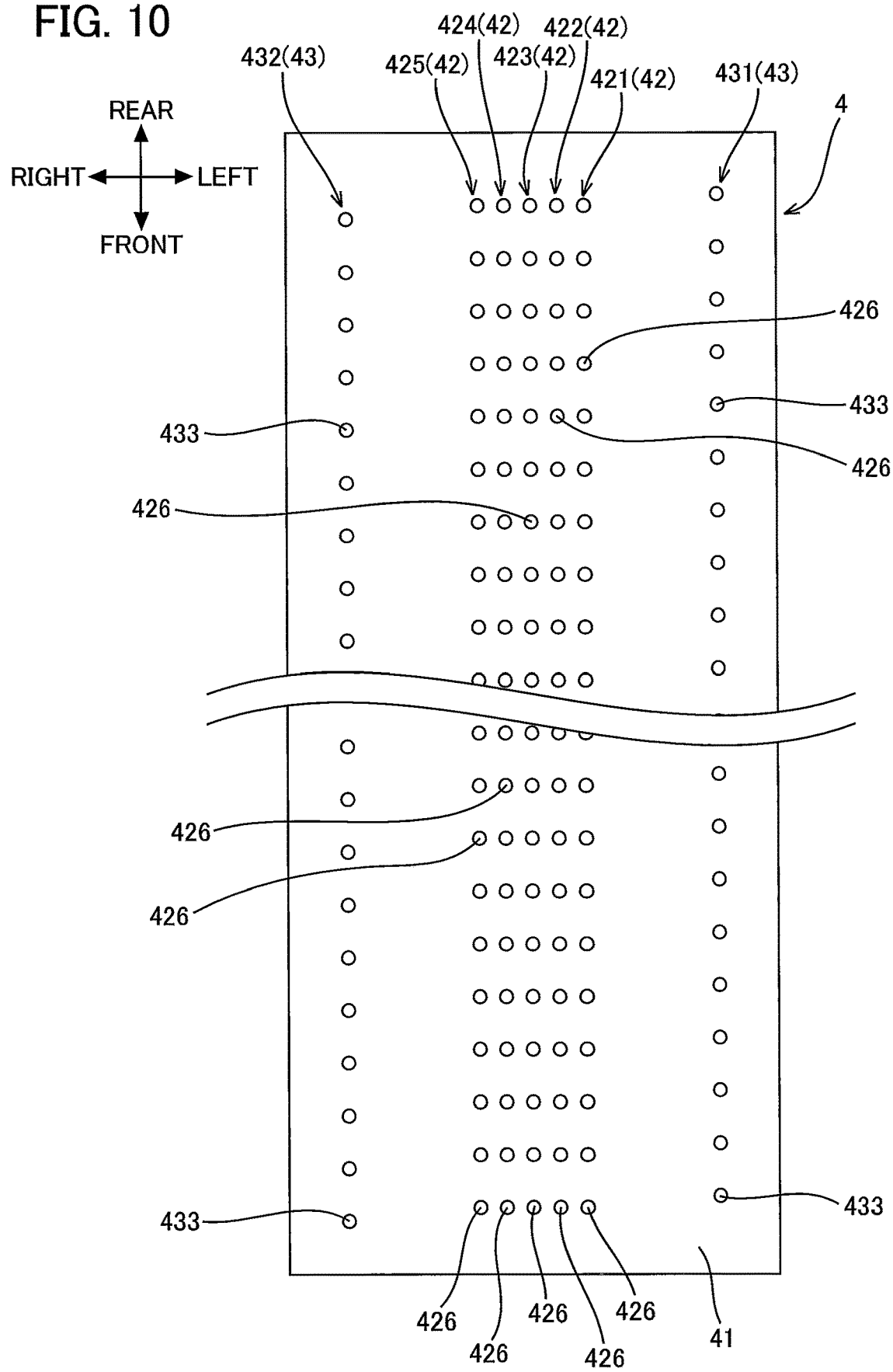
FIG. 10 is a bottom view of a driver IC of the inkjet head according to the embodiment of the present disclosure.

As illustrated in FIGS. 4 and 10, the driver circuit part 4 has a driver IC 41, a center bump electrode part 42, and individual bump electrode part 43. The driver IC 41 is an IC chip configured to output drive signals for driving the piezoelectric elements 221C. The driver IC 41 is bonded to the top surface 31B of the drive interconnection substrate 31 with an adhesive 4A, such as an anisotropic conductive film (ACF). FIG. 10 is a bottom view of the driver IC 41.

The center bump electrode part 42 electrically connects the feed interconnection part 37 to the driver IC 41. The center bump electrode part 42 includes a first bump electrode part 421, a second bump electrode part 422, a third bump electrode part 423, a fourth bump electrode part 424, and a fifth bump electrode part 425.

Each of the bump electrode parts 421-425 includes a plurality of bump electrodes 426. Each bump electrode 426 has a columnar shape that extends downward from the bottom surface of the driver IC 41. Each bump electrode 426 is formed of an electrically conductive material and electrically connected to the driver IC 41. In the present embodiment, each of the bump electrode parts 421-425 includes 200 (two hundred) bump electrodes 426.

Figure 11:
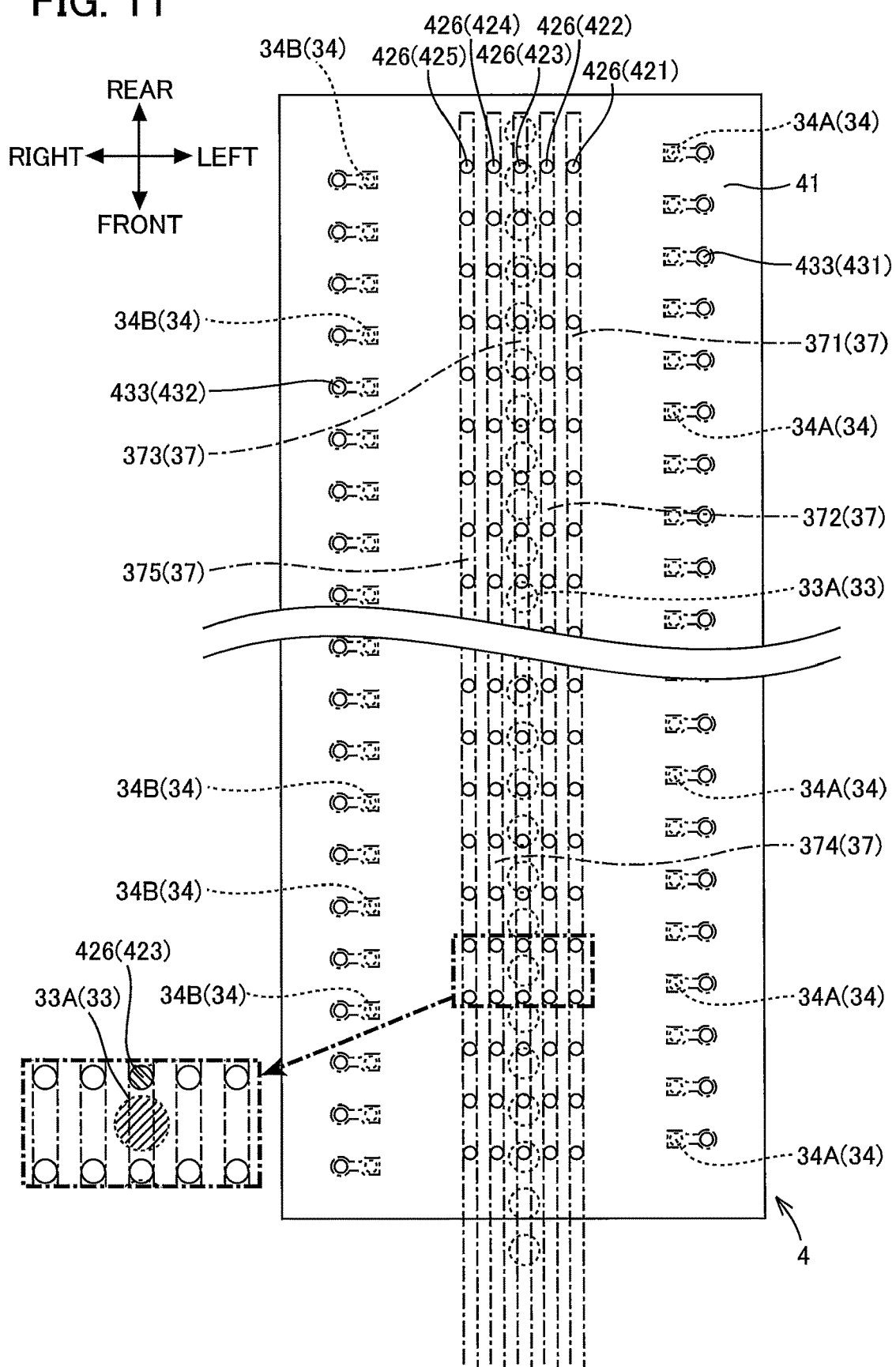
FIG. 11 is a view illustrating positional relationships among a common through-substrate interconnection part, an individual through-substrate interconnection part, a feed interconnection part, an individual interconnection part, a center bump electrode part, and an individual bump electrode part of the inkjet head according to the embodiment of the present disclosure.

As illustrated in FIGS. 10 and 11, the bump electrodes 426 possessed by the first bump electrode part 421 are provided at the left portion of the driver IC 41 and arrayed in the front-rear direction at regular intervals. Each of the bottom ends of the bump electrodes 426 in the first bump electrode part 421 is electrically bonded to the first feed interconnect 371 by the adhesive 4A. With this configuration, the power source voltage is applied from the terminal 14A to the driver IC 41 through the first feed interconnect 371. FIG. 11 illustrates the positional relationships among the common through-substrate interconnection part 33, individual through-substrate interconnection part 34, feed interconnection part 37, individual interconnection part 38, center bump electrode part 42, and individual bump electrode part 43.

The bump electrodes 426 possessed by the second bump electrode part 422 are provided at the left portion of the driver IC 41. More specifically, the bump electrodes 426 in the second bump electrode part 422 are positioned to the right of the first bump electrode part 421 and arrayed in the front-rear direction at regular intervals. Each of the bottom ends of the bump electrodes 426 in the second bump electrode part 422 is electrically bonded to the second feed interconnect 372 with the adhesive 4A. With this configuration, the drive voltage (drive signal) is applied from the terminal 14B to the driver IC 41 through the second feed interconnect 372.

The bump electrodes 426 possessed by the third bump electrode part 423 are provided at the left-right center of the driver IC 41 and arrayed in the front-rear direction at regular intervals. Each of the bottom ends of the bump electrodes 426 in the third bump electrode part 423 is electrically bonded to the third feed interconnect 373 with the adhesive 4A. With this configuration, the bias voltage is applied to the driver IC 41 from the terminal 14C through the third feed interconnect 373. That is, the bias voltage is applied from the terminal 14C through the third feed interconnect 373 to both the driver IC 41 and the common electrode 223 of the piezoelectric actuator 22. The plurality of bump electrodes 426 possessed by the third bump electrode part 423 is an example of a plurality of second connection bumps.

The bump electrodes 426 possessed by the fourth bump electrode part 424 are provided at the right portion of the driver IC 41. More specifically, the bump electrodes 426 in the fourth bump electrode part 424 are positioned to the right of the third bump electrode part 423 and arrayed in the front-rear direction at regular intervals. Each of the bottom ends of the bump electrodes 426 in the fourth bump electrode part 424 is electrically bonded to the fourth feed interconnect 374 with the adhesive 4A. With this configuration, the control signals are outputted from the terminal 14D to the driver IC 41 through the fourth feed interconnect 374.

The bump electrodes 426 possessed by the fifth bump electrode part 425 are provided at the right portion of the driver IC 41. More specifically, the bump electrodes 426 in the fifth bump electrode part 425 are positioned to the right of the fourth bump electrode part 424 and arrayed in the front-rear direction at regular intervals. Each of the bottom ends of the bump electrodes 426 in the fifth bump electrode part 425 is electrically bonded to the fifth feed interconnect 375 with the adhesive 4A. With this configuration, the ground voltage is applied from the terminal 14E to the driver IC 41 through the fifth feed interconnect 375.

As illustrated in FIGS. 4 and 11, each of the bump electrode parts 421-425 has the same number of bump electrodes 426. The distance (i.e., pitch) between the centers of any two bump electrodes 426 that neighbor each other in the front-rear direction is identical among the bump electrode parts 421-425.

The individual bump electrode part 43 electrically connects the individual interconnection part 38 to the driver IC 41. The individual bump electrode part 43 includes a left individual bump electrode part 431, and a right individual bump electrode part 432.

Each of the left individual bump electrode part 431 and right individual bump electrode part 432 includes a plurality of individual bump electrodes 433. Each individual bump electrode 433 has a columnar shape that extends downward from the bottom surface of the driver IC 41. In the present embodiment, the individual bump electrodes 433 are formed of the same electrically conductive material and in the same shape as the bump electrodes 426. Each of the individual bump electrodes 433 is electrically connected to the driver IC 41. In the present embodiment, each of the left individual bump electrode part 431 and right individual bump electrode part 432 possesses 200 (two hundred) individual bump electrodes 433.

The individual bump electrodes 433 possessed by the left individual bump electrode part 431 are provided at the left portion of the driver IC 41 in one-to-one correspondence with the left individual interconnects 38A. Specifically, each individual bump electrode 433 in the left individual bump electrode part 431 is disposed above the left end portion of the corresponding left individual interconnect 38A. The bottom end of each individual bump electrode 433 in the left individual bump electrode part 431 is electrically bonded to the corresponding left individual interconnect 38A by the adhesive 4A. With this configuration, each individual bump electrode 433 possessed by the left individual bump electrode part 431 is electrically connected through a one-on-one relationship to a single piezoelectric element 221C via the corresponding left individual interconnect 38A, left through-substrate interconnect 34A, left connection bump 361, left drive terminal 24A, and left drive electrode 222A.

The distance (i.e., pitch) between the center points of any two individual bump electrodes 433 that neighbor each other in the front-rear direction is identical between the left individual bump electrode part 431 and right individual bump electrode part 432, and also is the same as the distance between the center points of any two bump electrodes 426 that neighbor each other in the front-rear direction in the bump electrode parts 421-425.

The individual bump electrodes 433 possessed by the right individual bump electrode part 432 are provided at the right portion of the driver IC 41 in one-to-one correspondence with the right individual interconnects 38B. Specifically, each individual bump electrode 433 possessed by the right individual bump electrode part 432 is disposed above the right end portion of the corresponding right individual interconnect 38B. The bottom end of each individual bump electrode 433 possessed by the right individual bump electrode part 432 is electrically bonded to the corresponding right individual interconnect 38B by the adhesive 4A. With this configuration, each individual bump electrode 433 possessed by the right individual bump electrode part 432 is electrically connected through a one-on-one correspondence to a single piezoelectric element 221C via the corresponding right individual interconnect 38B, right through-substrate interconnect 34B, right connection bump 362, right drive terminal 24B, and right drive electrode 222B.

In the inkjet head 1 having the construction described above, when a control signal is inputted into the driver IC 41, the driver IC 41 outputs the drive signal(s) based on the control signal from one or more individual bump electrodes 433 in the individual bump electrode part 43. When the drive signal(s) are outputted, the one or more piezoelectric elements 221C corresponding to the one or more individual bump electrodes 433 outputting the drive signal(s) are driven, and the one or more driven piezoelectric elements 221C effect pressure change in the corresponding one or more pressure chambers 212. This pressure change causes an ink droplet to be ejected from each of the one or more nozzles 211 corresponding to the one or more pressure chambers 212.

Next, the area of a cross-section of the common through-substrate interconnection part 33 taken orthogonal to the thickness direction of the drive interconnection substrate 31 (up-down direction direction) and the electrical contact surface between the third bump electrode part 423 and the third feed interconnect 373 in the present embodiment will be described. In the following description, a cross-section of a single common through-substrate interconnect 33A taken orthogonal to the thickness direction of the drive interconnection substrate 31 will simply be called the "cross-section of a single common through-substrate interconnect 33A," and the electrical contact surface between one of the plurality of bump electrodes 426 possessed by the third bump electrode part 423 and the third feed interconnect 373 will simply be called the "electrical contact surface of a single bump electrode 426." Further, the electrical contact surface will signify the portions of the contacting surfaces of two objects that are electrically connected (the electrically conducting portions). As an example, when two electrically conductive objects are in contact, their entire contact surfaces are the electrical contact surfaces, but when an electrically insulating object is in contact with an electrically conductive object, contact surfaces exist but electrical contact surfaces do not. In the inset of FIG. 11, hatching marks slanting upward to the right denote the cross-section of a single common through-substrate interconnect 33A, while hatching marks slanting downward to the right denote the electrical contact surface of a single bump electrode 426.

As illustrated in FIG. 11, the area of the cross-section of a single common through-substrate interconnect 33A is larger than the area of the electrical contact surface of a single bump electrode 426. As described above, the number of common through-substrate interconnects 33A in the common through-substrate interconnection part 33 (300 in the present embodiment) is greater than the number of bump electrodes 426 belonging to the third bump electrode part 423 (200 in the present embodiment). Accordingly, the area of the cross-section (the cross-sectional area) of the common through-substrate interconnection part 33 taken orthogonal to the thickness direction (up-down direction) of the drive interconnection substrate 31 (i.e., the total area obtained by multiplying the area of the cross-section of a single common through-substrate interconnect 33A by the number of common through-substrate interconnects 33A) is greater than the area of the electrical contact surface (the electrical contact area) between the third bump electrode part 423 and third feed interconnect 373 (i.e., the total area obtained by multiplying the area of the electrical contact surface of a single bump electrode 426 by the number of bump electrodes 426 belonging to the third bump electrode part 423).

In the inkjet head 1 according to the present embodiment having the structure described above, the electrical path (i.e., the electrically conductive path) provided by the common through-substrate interconnection part 33 for connecting the embedded common interconnect 32 and the third feed interconnect 373 (hereinafter called the first electrical path) has a lower electrical resistance than that of the electrical path (i.e., the electrically conductive path) provided by the third bump electrode part 423 for connecting the third feed interconnect 373 and the driver IC 41 (hereinafter called the second electrical path). In other words, the electrical resistance of the common through-substrate interconnection part 33 is lower than that of the third bump electrode part 423.

Figure 12:
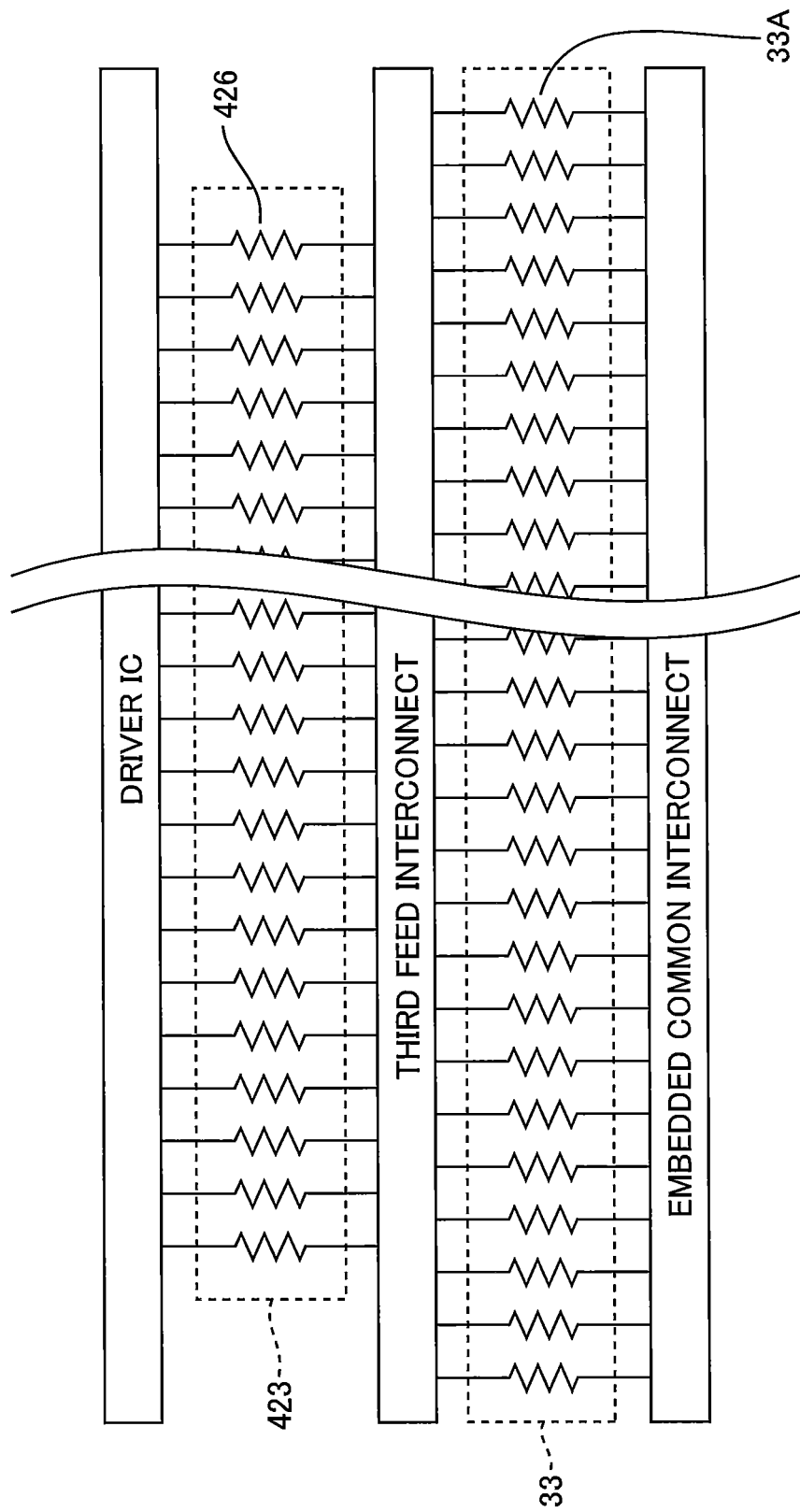
FIG. 12 is a schematic diagram illustrating a first electrical path and a second electrical path of the inkjet head according to the embodiment of the present disclosure.

As illustrated in FIG. 12, the electrical resistance of the first electrical path is the combined electrical resistance of the parallel common through-substrate interconnects 33A (in the present embodiment, the combined electrical resistance of 300 common through-substrate interconnects 33A that are connected in parallel), and the electrical resistance of the second electrical path is the combined electrical resistance of the parallel bump electrodes 426 possessed by the third bump electrode part 423 (in the present embodiment, the combined electrical resistance of 200 bump electrodes 426 that are connected in parallel). FIG. 12 is a schematic diagram illustrating the first electrical path and second electrical path.

In this way, the inkjet head 1 according to the present embodiment includes the drive interconnection substrate 31 (an example of a first substrate) having the bottom surface 31A (an example of a first surface) and the top surface 31B (an example of a second surface) on the opposite side from the bottom surface 31A; the channel forming substrate 21 (an example of a second substrate) that faces the bottom surface 31A; the plurality of piezoelectric elements 221C (an example of a plurality of driven elements) provided at the channel forming substrate 21 and arrayed in the front-rear direction (an example of a first direction) orthogonal to the thickness direction of the drive interconnection substrate 31; the driver IC 41 (an example of a drive circuit) that faces the top surface 31B and is capable of outputting drive signals for driving the plurality of piezoelectric elements 221C; the embedded common interconnect 32 (an example of a first interconnect) provided at the bottom surface 31A and extending in the front-rear direction; the third feed interconnect 373 (an example of a second interconnect) provided at the top surface 31B, the third feed inter connect 373 extending in the front-rear direction and electrically connectable to the terminal 14C (an example of a first external terminal); the common through-substrate interconnection part 33 (an example of a through-substrate interconnection part) penetrating the drive interconnection substrate 31 in the thickness direction and connecting the embedded common interconnect 32 and the third feed interconnect 373; the center bump part 35 (an example of a first bump part) electrically connecting the embedded common interconnect 32 and the plurality of piezoelectric elements 221C; and the third bump electrode part 423 (an example of a second bump part) electrically connecting the third feed interconnect 373 and the driver IC 41. Further, the electrical resistance of the first electrical path is lower than the electrical resistance of the second electrical path. In other words, the electrical resistance of the common through-substrate interconnection part 33 is lower than the electrical resistance of the third bump electrode part 423.

With this construction, the electrical resistance of the electrical path provided by the common through-substrate interconnection part 33 (the first electrical path) for electrically connecting the third feed interconnect 373 and the embedded common interconnect 32 is lower than the electrical resistance of the electrical path provided by the third bump electrode part 423 (the second electrical path) for electrically connecting the third feed interconnect 373 and the driver IC 41. Accordingly, the electrical resistance can be made lower for the electrical path electrically connected to the common electrode 223, which is common for the plurality of piezoelectric elements 221C. Consequently, this configuration can reduce the difference in supply power among the plurality of piezoelectric elements 221C, i.e., the difference in voltage applied across the left electrode portion 223A (or right electrode portion 223B) and the corresponding drive electrodes 222, thereby suppressing irregularities in driving characteristics among the plurality of piezoelectric elements 221C. As a result, the inkjet head 1 can properly record images, text and the like on the recording sheet P.

In the present embodiment, the area of the cross-section (i.e., the cross-sectional area) of the common through-substrate interconnection part 33 taken orthogonal to the thickness direction is greater than the area of the electrical contact surface (i.e., the electrical contact area) between the third feed interconnect 373 and third bump electrode part 423. This configuration can reduce the electrical resistance of the electrical path electrically connected to the common electrode 223, which is common to the plurality of piezoelectric elements 221C.

In the present embodiment, the common through-substrate interconnection part 33 includes a plurality of common through-substrate interconnects 33A (an example of a plurality of through-substrate interconnects) arrayed in the front-rear direction. Each of the common through-substrate interconnects 33A penetrates the drive interconnection substrate 31 in the thickness direction, and electrically connects the embedded common interconnect 32 and the third feed interconnect 373.

In the present embodiment, the center bump part 35 includes a plurality of center connection bumps 351 (an example of a plurality of connection bumps) electrically connecting the embedded common interconnect 32 and the piezoelectric elements 221C. As illustrated in FIG. 7, at least one of the center connection bumps 351 in the center bump part 35 partially overlaps one of the common through-substrate interconnects 33A as viewed in the thickness direction. That is, at least one of the center connection bumps 351 in the center bump part 35 has a portion overlapped with one of the common through-substrate interconnects 33A as viewed in the thickness direction.

In the present embodiment, at least one of the common through-substrate interconnects 33A has a portion overlapped with both the embedded common interconnect 32 and third feed interconnect 373 as viewed in the thickness direction. This configuration can better reduce the electrical resistance of the first electrical path since at least one of the common through-substrate interconnects 33A is electrically connected to both the embedded common interconnect 32 and third feed interconnect 373 at the minimum distance.

In the present embodiment, the third bump electrode part 423 includes a plurality of bump electrodes 426 (an example of connection bumps) arrayed in the front-rear direction. Each of the bump electrodes 426 in the third bump electrode part 423 electrically connects the third feed interconnect 373 and driver IC 41.

In the present embodiment, the area of a cross-section (i.e., the cross-sectional area) of at least one of the common through-substrate interconnects 33A taken orthogonal to the thickness direction is greater than the area of the electrical contact surface (i.e., the electrical contact area) between the third feed interconnect 373 and one of the bump electrodes 426 belonging to the third bump electrode part 423. Thus, it is possible to reduce the electrical resistance of the electrical path electrically connected to the common electrode 223 that is common to the plurality of piezoelectric elements 221C.

Further, since the number of common through-substrate interconnects 33A is greater than the number of bump electrodes 426 in the third bump electrode part 423 in the present embodiment, the electrical resistance of the electrical path electrically connected to the common electrode 223 that is common to all piezoelectric elements 221C can be reduced. Note that the number of common through-substrate interconnects 33A is not limited to the above-described number as long as the number of common through-substrate interconnects 33A is greater than or equal to the number of bump electrodes 426 belonging to the third bump electrode part 423. For example, the number of common through-substrate interconnects 33A may be equal to the number of bump electrodes 426 belonging to the third bump electrode part 423.

The inkjet head 1 according to the present embodiment includes the left individual bump electrode part 431 (an example of the third bump part) electrically connected to the driver IC 41 for outputting the drive signals to the piezoelectric elements 221C. That is, the driver IC is capable of outputting the drive signals to the piezoelectric elements 221C through the left individual bump electrode part 431.

In the present embodiment, the left individual bump electrode part 431 includes the plurality of individual bump electrodes 433 (an example of a plurality of connection bumps) arrayed in the front-rear direction. Each of the individual bump electrodes 433 is connected to the driver IC 41. Further, the number of bump electrodes 426 in the third bump electrode part 423 is equal to the number of individual bump electrodes 433 in the left individual bump electrode part 431. Hence, the bonding yield between the driver IC 41 and drive interconnection substrate 31 can be improved. Note that the number of bump electrodes 426 in the third bump electrode part 423 is not limited to the above-described number, and the number of bump electrodes 426 in the third bump electrode part 423 may be greater than the number of individual bump electrodes 433 in the left individual bump electrode part 431.

Particularly in the present embodiment, the number of bump electrodes 426 in the third bump electrode part 423 is equivalent to the number of individual bump electrodes 433 in the left individual bump electrode part 431, and the distance between centers of any two neighboring bump electrodes 426 is equivalent to the distance between the centers of any two neighboring individual bump electrodes 433. With this configuration, when the driver IC 41 and drive interconnection substrate 31 are bonded together using adhesive containing electrically conductive particles, such as ACF, the differences in movement patterns (or array patterns) of the electrically conductive particles among the plurality of bump electrodes are greatly reduced. Hence, this arrangement can dramatically improve the bonding yield between the driver IC 41 and drive interconnection substrate 31.

In the present embodiment, the inkjet head 1 includes the first feed interconnect 371 (an example of a third interconnect) provided at the top surface 31B of the drive interconnection substrate 31 so as to extend in the front-rear direction and connectable to the terminal 14A (an example of a second external terminal); and the first bump electrode part 421 (an example of a fourth bump part) electrically connecting the first feed interconnect 371 and the driver IC 41.

In the present embodiment, the first bump electrode part 421 includes a plurality of bump electrodes 426 arrayed in the front-rear direction and are connected to the first feed interconnect 371 and the driver IC 41. Further, the number of bump electrodes 426 in the third bump electrode part 423 is equal to the number of bump electrodes 426 in the first bump electrode part 421. Hence, this configuration can dramatically improve the bonding yield between the driver IC 41 and drive interconnection substrate 31. Note that the number of bump electrodes 426 in the third bump electrode part 423 is not limited to the above-described number, and the number of bump electrodes 426 in the third bump electrode part 423 may be greater than the number of bump electrodes 426 in the first bump electrode part 421.

While the present embodiment has been described in detail, it would be apparent to those skilled in the art that many modifications and variations may be made thereto.

Figure 13:
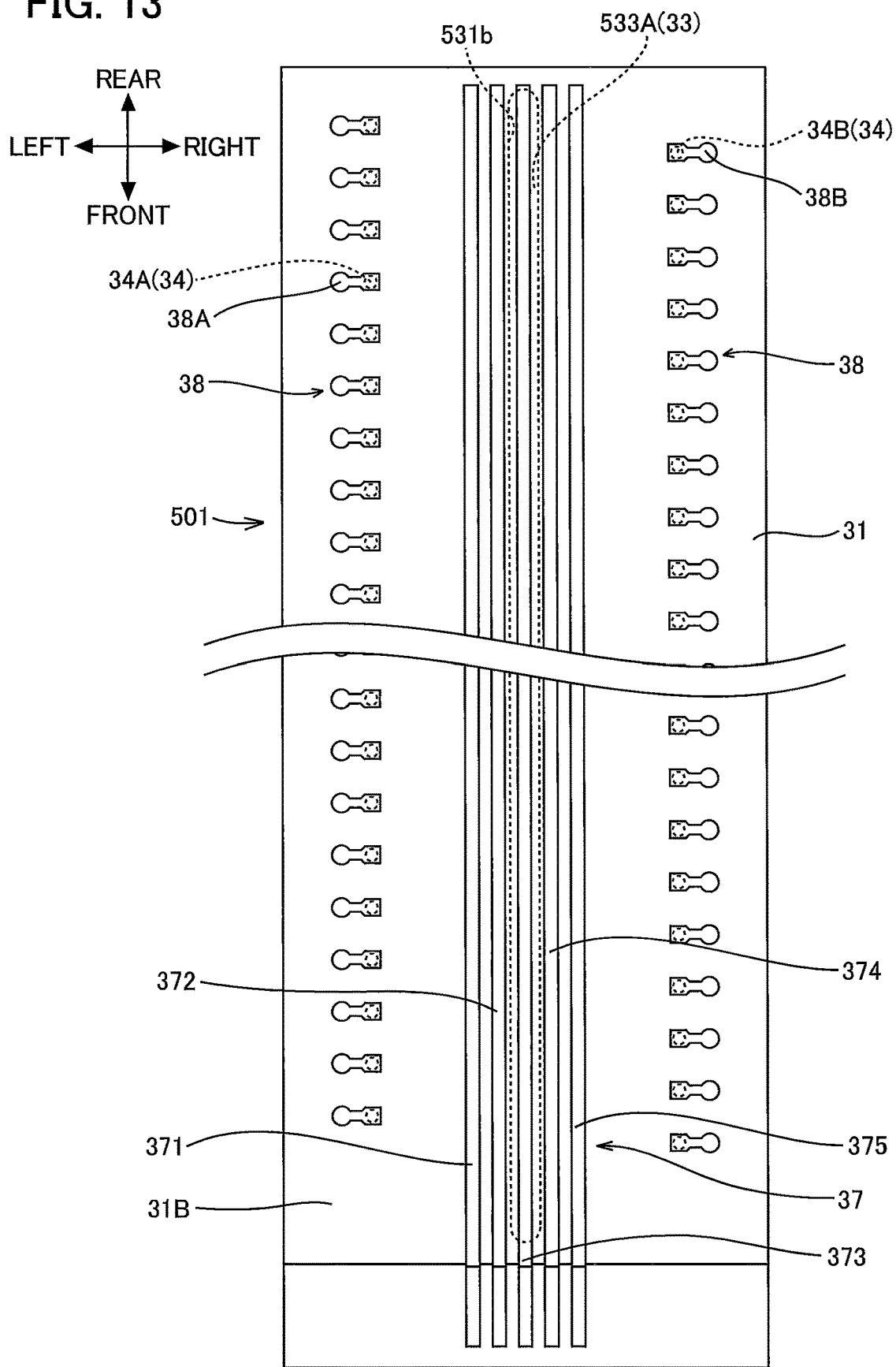
FIG. 13 is a view illustrating an inkjet head according to a first variation of the embodiment of the present disclosure.

For example, FIG. 13 illustrates an inkjet head 501 according to a first variation of the embodiment of the present disclosure. As illustrated in FIG. 13, the drive interconnection substrate 31 of the inkjet head 501 is formed with a single slit 531b in place of the plurality of central through-holes 31b. In addition, the common through-substrate interconnection part 33 of the inkjet head 501 has a single through-substrate interconnect 533A in place of the plurality of common through-substrate interconnects 33A described above.

The single slit 531b extends in the front-rear direction and penetrates the drive interconnection substrate 31 in the thickness direction thereof. The through-substrate interconnect 533A is provided inside the single slit 531b. More specifically, the through-substrate interconnect 533A is formed by filling the single slit 531b with an electrically conductive material. The through-substrate interconnect 533A extends in the front-rear direction and penetrates the drive interconnection substrate 31 in the thickness direction thereof. Note that, also in the inkjet head 501, the electrical resistance of the first electrical path is lower than the electrical resistance of the second electrical path. Accordingly, this first variation of the embodiment of the present disclosure can obtain the same effects as the inkjet head 1 according to the embodiment.

Figure 14:
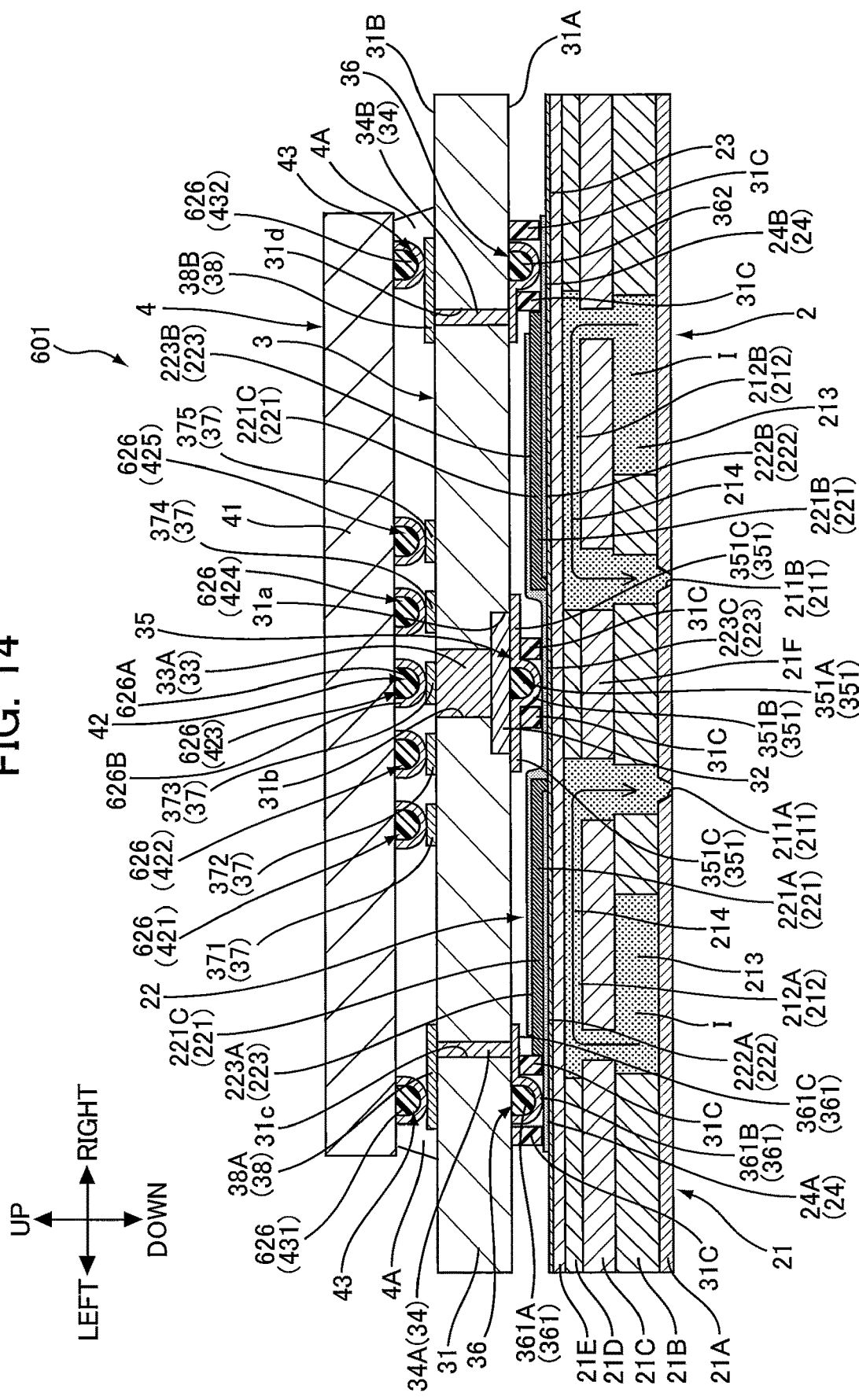
FIG. 14 is a view illustrating an inkjet head according to a second variation of the embodiment of the present disclosure.

FIG. 14 illustrates an inkjet head 601 according to a second variation of the embodiment of the present disclosure. As illustrated in FIG. 14, in the inkjet head 601, each of the first bump electrode part 421, second bump electrode part 422, third bump electrode part 423, fourth bump electrode part 424, fifth bump electrode part 425, left individual bump electrode part 431, and right individual bump electrode part 432 has a plurality of connection bumps 626 in place of the plurality of bump electrodes 426 or the plurality of individual bump electrodes 433 in the embodiment, and also has a plurality of core-connecting portions 627. The plurality of connection bumps 626 of the third bump electrode part 423 is an example of a plurality of second connection bumps.

Figure 15:
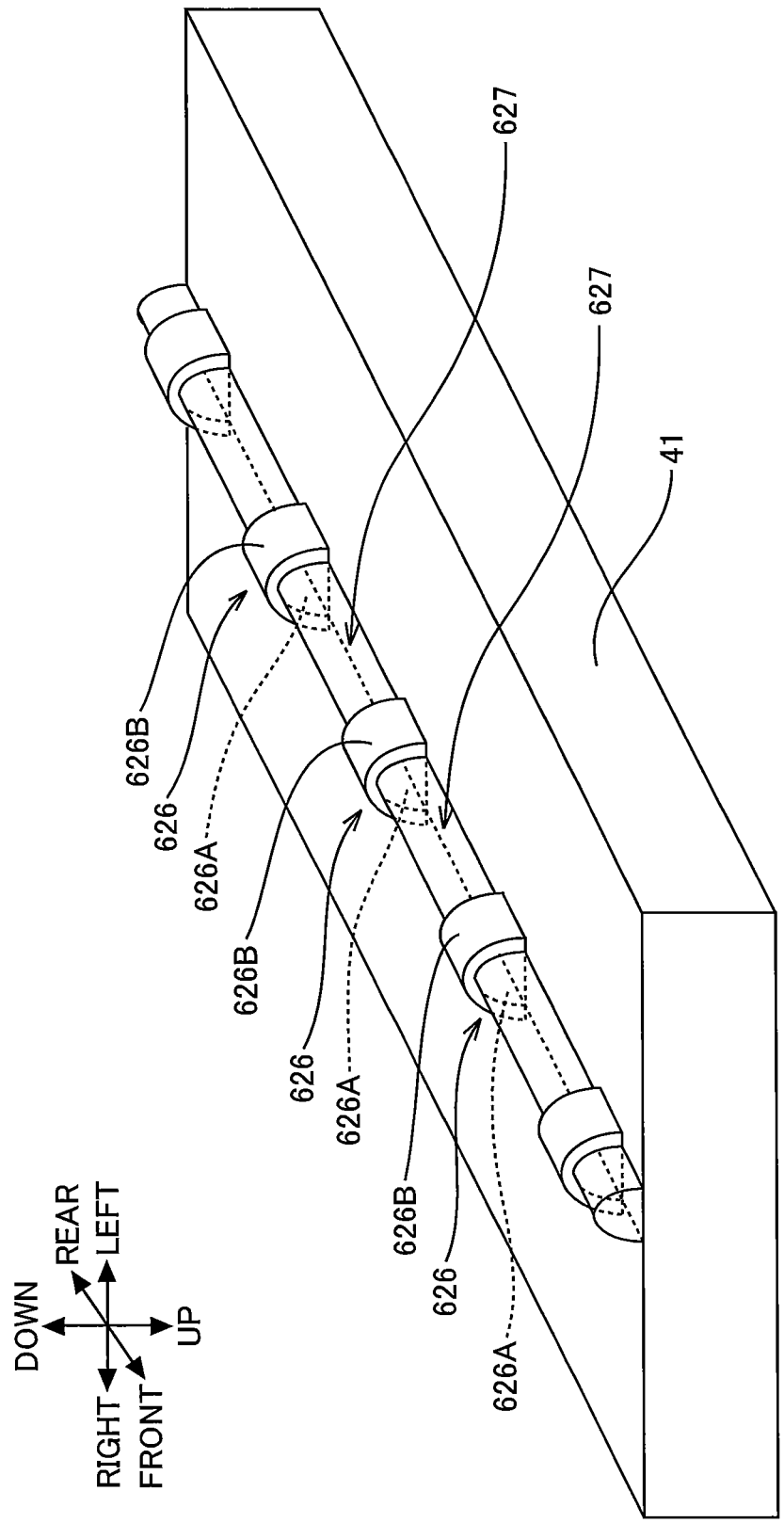
FIG. 15 is a perspective view illustrating connection bumps and core-connecting portions of the inkjet head according to the second variation of the embodiment of the present disclosure.

FIG. 15 is a perspective view illustrating the connection bumps 626 and the core-connecting portions 627 of the inkjet head 601. As illustrated in FIG. 15, the core-connecting portions 627 have the same shape and are formed of the same material as the core-connecting portions 352 in the inkjet head 1 according to the embodiment. Each of the plurality of connection bumps 626 has a core portion 626A and a cover portion 626B. The core portion 626A is formed in the same shape and of the same material as the core portion 351A of the inkjet head 1 according to the embodiment. The cover portion 626B is formed in the same shape and of the same material as the cover portion 351B of the inkjet head 1 according to the embodiment.

In the second variation described above, each of the connection bumps 626 in the third bump electrode part 423 has the core portion 626A and cover portion 626B. The core portion 626A is made of a resin material and protrudes from the driver IC 41 toward the drive interconnection substrate 31. The cover portion 626B is formed of an electrically conductive material and electrically connects the third feed interconnect 373 and the driver IC 41. Also, the cover portion 626B covers the core portion 626A. With this configuration, the core portion 626A gives the connection bumps 626 elasticity. Accordingly, the connection bumps 626 can further reliably conduct electricity between the driver IC 41 and drive interconnection substrate 31. That is, a more reliable electrical connection between the driver IC 41 and drive interconnection substrate 31 can be established by the connection bumps 626.

As described above, the third bump electrode part 423 in the second variation includes the plurality of core-connecting portions 627. The core-connecting portions 627 are made of a resin material and extend in the front-rear direction. Every two core portions 626A that neighbor each other in the front-rear direction are integrally formed with each other through one of the core-connecting portions 627. Note that, also in the inkjet head 601, the electrical resistance of the first electrical path is lower than the electrical resistance of the second electrical path. Accordingly, the second variation of the embodiment of the present disclosure can obtain the same effects as the inkjet head 1 according to the embodiment.

While the present embodiment and its variations described above are examples in which the present invention has been applied to an inkjet head, the electronic device to which the present invention can be applied is not limited to devices (such as the inkjet head) used in applications that apply pressure to a liquid. The present invention may be applied to other applications, such as generating displacing or vibrations in a plurality of solid driven objects by arranging a plurality of piezoelectric elements on a substrate and driving the piezoelectric elements using a driver IC to deform the substrate.

In addition, the present invention targets a wide range of heads in general. For example, the present invention may be applied to: recording heads used in printers and other image-recording devices, such as any of various inkjet recording heads; colorant ejecting heads used in the manufacturing of color filters for liquid crystal displays and the like; electrode material ejecting heads used in the formation of electrodes for organic EL displays (OLED displays), field-emission displays (FED), and the like; and bio-organic matter ejecting heads used in the manufacturing of biochips.

The present invention also targets a wide range of MEMS devices and may be applied to MEMS devices other than recording heads. One example of such a MEMS device is a device that detects a signal from an external source and changes the value of an electric current after the signal is detected. Examples of these types of MEMS devices are ultrasonic devices, motors, pressure sensors, pyroelectric elements, and ferroelectric elements. Further, the MEMS devices to which the present invention can be applied includes finished products that incorporate the above-described MEMS devices. Examples of the finished products include: ejecting devices using the above heads to eject liquid or the like; ultrasonic sensors using the above ultrasonic devices; robots using the above motors as drive sources; infrared sensors using the above pyroelectric elements; and ferroelectric memory using the above ferroelectric elements. Applications of the present invention to the above-described MEMS devices enable the same to detect microcurrents.

The present invention also targets a wide range of interconnection substrates and may be applied to interconnection substrates for devices other than MEMS devices.

What is claimed is:

1. An electronic device comprising:
   a first substrate having a first surface and a second surface opposite from the first surface, the first substrate having a thickness defining a thickness direction, the first substrate extending in a first direction orthogonal to the thickness direction;
   a second substrate facing the first surface;
   a plurality of first driven elements provided at the second substrate and arrayed in the first direction to form a first row of driven elements;
   a plurality of second driven elements provided at the second substrate and arrayed in the first direction to form a second row of driven elements;
   a first interconnect provided at the first surface and extending in the first direction;
   a second interconnect provided at the second surface and extending in the first direction between the first row of driven elements and the second row of driven elements, the second interconnect being configured to be electrically connected to a first external terminal;
   a through-substrate interconnection part penetrating the first substrate in the thickness direction and electrically connecting the first interconnect and the second interconnect;
   a common electrode to which the plurality of first driven elements and the plurality of second driven elements are commonly connected;
   a first bump part electrically connecting the first interconnect and the common electrode; and
   a second bump part provided on the second interconnect and electrically connected to the second interconnect,
   wherein the through-substrate interconnection part has a cross-sectional area orthogonal to the thickness direction, the cross-sectional area being greater than an electrical contact area between the second interconnect and the second bump part.

2. The electronic device according to claim 1, wherein the through-substrate interconnection part is a single through-substrate interconnect extending in the first direction.

3. The electronic device according to claim 1, wherein the through-substrate interconnection part comprises a plurality of through-substrate interconnects arrayed in the first direction, each of the plurality of through-substrate interconnects penetrating the first substrate in the thickness direction and electrically connecting the first interconnect and the second interconnect.

4. The electronic device according to claim 3, wherein the first bump part comprises a plurality of connection bumps electrically connecting the first interconnect and the common electrode,
   wherein at least one of the plurality of connection bumps has a portion overlapped with one of the plurality of through-substrate interconnects as viewed in the thickness direction.

5. The electronic device according to claim 3, wherein at least one of the plurality of through-substrate interconnects has a portion overlapped with both the first interconnect and the second interconnect as viewed in the thickness direction.

6. The electronic device according to claim 3, wherein the second bump part comprises a plurality of connection bumps arrayed in the first direction, each of the plurality of connection bumps being provided on the second interconnect and electrically connected to the second interconnect.

7. The electronic device according to claim 6, wherein at least one of the plurality of through-substrate interconnects has a cross-sectional area orthogonal to the thickness direction, the cross-sectional area being greater than an electrical contact area between the second interconnect and one of the plurality of connection bumps.

8. The electronic device according to claim 6, wherein a number of the plurality of through-substrate interconnects is greater than or equal to a number of the plurality of connection bumps.

9. The electronic device according to claim 6, further comprising:
   a third interconnect provided at the second surface and extending in the first direction between the first row of driven elements and the second row of driven elements, the third interconnect being configured to be electrically connected to a second external terminal; and
   a fourth bump part provided on the third interconnect and electrically connected to the third interconnect.

10. The electronic device according to claim 9, wherein the fourth bump part comprises a plurality of connection bumps arrayed in the first direction, each of the plurality of connection bumps of the fourth bump part being provided on the third interconnect and electrically connected to the third interconnect, and
    wherein a number of the plurality of connection bumps of the second bump part is greater than or equal to a number of the plurality of connection bumps of the fourth bump part.

11. The electronic device according to claim 6, wherein each of the plurality of connection bumps comprises:
    a core portion made of resin; and
    a cover portion covering the core portion, the cover portion being formed of electrically conductive material and electrically connected to the second interconnect.

12. The electronic device according to claim 11, wherein the second bump part further comprises a plurality of core-connecting portions extending in the first direction and made of resin, and
    wherein two core portions that neighbor in the first direction are integrally formed through one of the plurality of core-connecting portions.

13. An electronic device comprising:
    a first substrate having a first surface and a second surface opposite from the first surface, the first substrate having a thickness defining a thickness direction, the first substrate extending in a first direction orthogonal to the thickness direction;
    a second substrate facing the first surface;
    a plurality of first driven elements provided at the second substrate and arrayed in the first direction to form a first row of driven elements;
    a plurality of second driven elements provided at the second substrate and arrayed in the first direction to form a second row of driven elements;
    a first interconnect provided at the first surface and extending in the first direction;
    a second interconnect provided at the second surface and extending in the first direction between the first row of driven elements and the second row of driven elements, the second interconnect being configured to be electrically connected to an external terminal;
    a plurality of through-substrate interconnects penetrating the first substrate in the thickness direction and electrically connecting the first interconnect and the second interconnect;

a common electrode to which the plurality of first driven elements and the plurality of second driven elements are commonly connected;

a plurality of first connection bumps electrically connecting the first interconnect and the common electrode; and a plurality of second connection bumps provided on the second interconnect and electrically connected to the second interconnect wherein each of the plurality of through-substrate interconnects has a cross-sectional area orthogonal to the thickness direction, each of the plurality of second connection bumps having an electrical contact area with the second interconnect, a total of the cross-sectional areas of the plurality of through-substrate interconnects being greater than a total of the electrical contact areas of the plurality of second connection bumps.

* * * * *